United States Patent
Fuwa

(10) Patent No.: US 9,760,232 B2
(45) Date of Patent: Sep. 12, 2017

(54) CURRENT OUTPUT CIRCUIT

(71) Applicant: Renesas Electronics Corporation, Tokyo (JP)

(72) Inventor: Kosuke Fuwa, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/946,655

(22) Filed: Nov. 19, 2015

(65) Prior Publication Data

US 2016/0233878 A1 Aug. 11, 2016

(30) Foreign Application Priority Data

Feb. 10, 2015 (JP) .................................. 2015-023950

(51) Int. Cl.
| | |
|---|---|
| *G06F 3/045* | (2006.01) |
| *H03M 1/68* | (2006.01) |
| *G06F 3/041* | (2006.01) |
| *G06F 3/046* | (2006.01) |
| *H03M 1/74* | (2006.01) |
| *H03M 1/76* | (2006.01) |

(52) U.S. Cl.
CPC .............. *G06F 3/045* (2013.01); *G06F 3/046* (2013.01); *G06F 3/0416* (2013.01); *H03M 1/68* (2013.01); *H03M 1/745* (2013.01); *H03M 1/765* (2013.01)

(58) Field of Classification Search
CPC combination set(s) only.
See application file for complete search history.

(56) References Cited

U.S. PATENT DOCUMENTS

| | | | | | |
|---|---|---|---|---|---|
| 3,604,902 A | * | 9/1971 | Munt | ...................... | H03M 1/50 341/157 |
| 3,746,997 A | * | 7/1973 | Willett | ...................... | H03J 7/04 327/47 |
| 4,194,240 A | * | 3/1980 | Davis | .................... | H02M 7/217 324/120 |
| 4,686,987 A | * | 8/1987 | Salo | .................... | A61N 1/36521 607/24 |
| 6,377,163 B1 | * | 4/2002 | Deller | ................. | H02J 13/0031 307/2 |
| 6,484,223 B1 | * | 11/2002 | Lenz | ................. | H04L 25/03834 327/50 |
| 6,987,507 B2 | | 1/2006 | Oda | | |

FOREIGN PATENT DOCUMENTS

| | | |
|---|---|---|
| JP | 2003-202955 A | 7/2003 |
| JP | 2011-097191 A | 5/2011 |

* cited by examiner

*Primary Examiner* — Van Chow
(74) *Attorney, Agent, or Firm* — McGinn IP Law Group, PLLC

(57) ABSTRACT

Provided is a current output circuit 1 including a pseudo sine wave separation circuit 11 that separates a pseudo sine wave represented by a digital code Din into two pseudo half-waves represented by digital signals D1 and D2, a DA converter 113 that converts the pseudo half-wave represented by the digital signal D1 into an analog half-wave signal V1, a DA converter 114 that converts the pseudo half-wave represented by the digital signal D2 into an analog half-wave signal V2, and a voltage-current conversion circuit 12 that converts voltages of the half-wave signals V1 and V2 into currents and outputs a current Iout obtained by combining the currents.

8 Claims, 20 Drawing Sheets

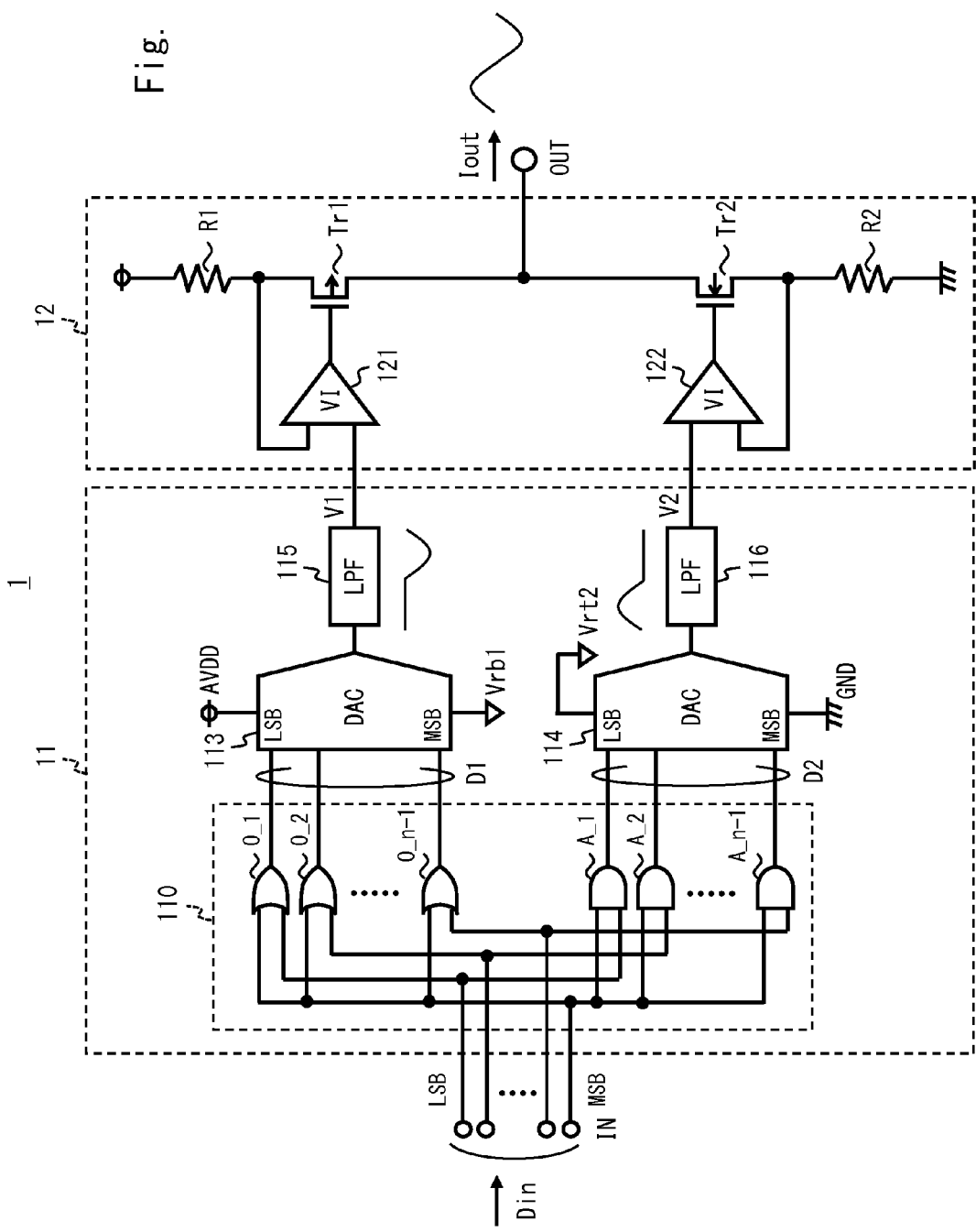

| DAC113→LPF115→VI121→Tr1 ROUTE |||||||||
|---|---|---|---|---|---|---|---|---|
| INPUT CODE ||| DAC INPUT CODE ||| DAC OUTPUT | OUTPUT CURRENT ||
| MSB | | LSB | MSB | | LSB | | CURRENT VALUE | DIRECTION |
| 1 | 1 | 1 | 1 | 1 | 1 | AVDD | 0 | Source |
| 1 | 1 | 1 | 0 | 1 | 1 | AVDD | 0 | |
| 1 | 1 | 0 | 1 | 1 | 1 | AVDD | 0 | |
| 1 | 1 | 0 | 0 | 1 | 1 | AVDD | 0 | |
| 1 | 0 | 1 | 1 | 1 | 1 | AVDD | 0 | |
| 1 | 0 | 1 | 0 | 1 | 1 | AVDD | 0 | |
| 1 | 0 | 0 | 1 | 1 | 1 | AVDD | 0 | |
| 1 | 0 | 0 | 0 | 1 | 1 | AVDD | 0 | |
| 0 | 1 | 1 | 1 | 1 | 1 | AVDD | 0 | |
| 0 | 1 | 1 | 0 | 1 | 1 | 0 | · | · |
| 0 | 1 | 0 | 1 | 1 | 0 | 1 | · | · |
| 0 | 1 | 0 | 0 | 1 | 0 | 0 | · | · |
| 0 | 0 | 1 | 1 | 0 | 1 | 1 | · | · |
| 0 | 0 | 1 | 0 | 0 | 1 | 0 | · | · |
| 0 | 0 | 0 | 1 | 0 | 0 | 1 | · | · |
| 0 | 0 | 0 | 0 | 0 | 0 | 0 | AVDD−Vrb1 | Vrb1/R1 |

Fig. 9

| DAC114→LPF116→VI122→Tr2 ROUTE ||||||||
|---|---|---|---|---|---|---|---|
| INPUT CODE ||| DAC INPUT CODE ||| DAC OUTPUT | OUTPUT CURRENT ||
| MSB | | LSB | MSB | | LSB | | CURRENT VALUE | DIRECTION |
| 1 | 1 | 1 | 1 | 1 | 1 | 1 | Vrt2+GND | Vrt2/R2 | |
| 1 | 1 | 1 | 0 | 1 | 1 | 0 | · | · | |
| 1 | 1 | 0 | 1 | 1 | 0 | 1 | · | · | |
| 1 | 1 | 0 | 0 | 1 | 0 | 0 | · | · | |
| 1 | 0 | 1 | 1 | 0 | 1 | 1 | · | · | |
| 1 | 0 | 1 | 0 | 0 | 1 | 0 | · | · | |
| 1 | 0 | 0 | 1 | 0 | 0 | 1 | · | · | |
| 1 | 0 | 0 | 0 | 0 | 0 | 0 | GND | 0 | Sink |
| 0 | 1 | 1 | 1 | 0 | 0 | 0 | GND | 0 | |
| 0 | 1 | 1 | 0 | 0 | 0 | 0 | GND | 0 | |
| 0 | 1 | 0 | 1 | 0 | 0 | 0 | GND | 0 | |
| 0 | 1 | 0 | 0 | 0 | 0 | 0 | GND | 0 | |
| 0 | 0 | 1 | 1 | 0 | 0 | 0 | GND | 0 | |
| 0 | 0 | 1 | 0 | 0 | 0 | 0 | GND | 0 | |
| 0 | 0 | 0 | 1 | 0 | 0 | 0 | GND | 0 | |
| 0 | 0 | 0 | 0 | 0 | 0 | 0 | GND | 0 | |

Fig. 10

CURRENT OUTPUT CIRCUIT

CROSS-REFERENCE TO RELATED APPLICATIONS

This application is based upon and claims the benefit of priority from Japanese patent application No. 2015-023950, filed on Feb. 10, 2015, the disclosure of which is incorporated herein in its entirety by reference.

BACKGROUND

The present invention relates to a current output circuit and to, for example, a current output circuit disposed in a position detection apparatus.

A position detection apparatus that detects a contact position of an electromagnetic induction pen which will be in contact with a panel surface is mounted on an electromagnetic induction panel. The position detection apparatus includes a sensor coil disposed on the panel and a current output circuit that outputs a high frequency current to the sensor coil. The position detection apparatus detects a contact position of a contact object on the panel based on a voltage signal that is received by the sensor coil.

Japanese Unexamined Patent Application Publication No. 2003-202955 discloses a current transmission circuit (current output circuit) that is disposed in a position detection apparatus. This current transmission circuit uses a separation circuit to separate an analog sine wave into two half-wave signals, converts the voltages of the half-wave signals into currents, combines the currents, and outputs the combined current. Japanese Unexamined Patent Application Publication No. 2011-97191 discloses a specific configuration of the separation circuit.

SUMMARY

It is considered that the analog sine wave that is input to the separation circuit disposed in the current transmission circuit which is disclosed in Japanese Unexamined Patent Application Publication No. 2003-202955 is generated by converting the pseudo sine wave represented by a digital code into the analog sine wave using a DA converter, smoothing the analog sine wave using a low-pass filter, and adjusting an amplitude of the analog sine wave using a gain adjusting circuit.

The present inventor has found out a problem that in the current transmission circuit disclosed in Japanese Unexamined Patent Application Publication No. 2003-202955, as a large-scale analog circuit such as the gain adjusting circuit and the separation circuit for the analog sine wave as described above is necessary, the circuit size will become large. Other problems of the related art and new features of the present invention will become apparent from the following descriptions of the specification and attached drawings.

An aspect of the present invention is a current output circuit includes: a separation circuit that separates a digital pseudo sine wave into first and second digital pseudo half-waves; a first DA converter that converts the first digital pseudo half-wave into a first analog half-wave signal; a second DA converter that converts the second digital pseudo half-wave into a second analog half-wave signal; and a voltage-current conversion circuit that converts voltages of the first and second half-wave signals into currents and outputs a current obtained by combining the currents.

According to the above aspect, it is possible to provide a current output circuit that is capable of preventing an increase in a circuit size.

BRIEF DESCRIPTION OF THE DRAWINGS

The above and other aspects, advantages and features will be more apparent from the following description of certain embodiments taken in conjunction with the accompanying drawings, in which:

FIG. 1 is a drawing showing a configuration example of a current output circuit according to a first embodiment;

FIG. 9 is a drawing showing a result of outputs from components that are disposed on one path of the current output circuit shown in FIG. 1;

FIG. 10 is a drawing showing a result of outputs from components that are disposed on the other path of the current output circuit shown in FIG. 1;

DETAILED DESCRIPTION

Figure 2A:
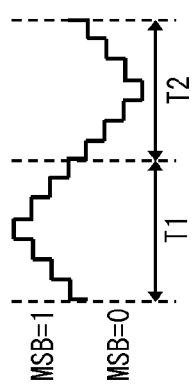
FIGS. 2A to 2D are drawings showing output waveforms of components that are disposed in the current output circuit shown in FIG. 1.

Hereinafter, embodiments shall be explained with reference to the drawings. The drawings are in a simplified form, and the technical scope of the embodiments should not be interpreted to be limited to the drawings. The same elements are denoted by the same reference numerals, and repeated explanations are omitted.

The invention will be described by dividing it into a plurality of sections or embodiments whenever circumstances require it for convenience in the following embodiments. However, unless otherwise particularly specified, these sections or embodiments are not irrelevant to one another. One section or embodiment is related to modifications, applications, details, supplementary explanations, and the like of some or all of the other ones. When reference is made to the number of elements or the like (including the number of pieces, numerical values, quantity, range, etc.) in the following embodiments, the number thereof is not limited to a specific number and may be greater than or less than or equal to the specific number unless otherwise particularly specified and definitely limited to the specific number in principle.

Further, in the following embodiments, components (including operation steps, etc.) are not always essential unless otherwise particularly specified and considered to be definitely essential in principle.

Similarly, when reference is made to the shapes, positional relations, and the like of the components or the like in the following embodiments, they will include ones, for example, substantially approximate or similar in their shapes or the like unless otherwise particularly specified and considered not to be definitely so in principle. The above is similarly applicable even to the above-described number or the like (including the number of pieces, numerical values, quantity, range, etc.)

First Embodiment

FIG. 1 is a drawing showing a configuration example of a current output circuit 1 according to a first embodiment. The current output circuit 1 according to this embodiment separates a digital pseudo sine wave into two pseudo half-waves, converts the separated pseudo half-waves into analog half-wave signals, converts voltages of the analog half-wave signals into currents, combines the currents, and outputs the combined current as an analog sine wave signal. Accordingly, it is unnecessary for the current output circuit 1 according to this embodiment to include a large-scale analog circuit such as a gain adjusting circuit and a separation circuit for the analog sine wave. It is thus possible for the circuit size and current consumption of the current output circuit 1 according to this embodiment to be reduced more than they can be reduced when the digital pseudo sine wave is converted into the analog sine wave, and then the analog sine wave is separated into two half-wave signals.

A more specific explanation of the above shall be given as follows.

The current output circuit 1 is disposed in, for example, a position detection apparatus mounted on an electromagnetic induction touch panel and is a circuit for outputting an analog sine wave signal Iout that corresponds to the analog sine wave based on a pseudo sine wave represented by a digital code Din.

Note that the position detection apparatus mounted on the electromagnetic induction panel includes a sensor coil disposed on a panel and a current output circuit for outputting a high frequency current to the sensor coil and detects a contact position of a contact object on the panel based on a voltage signal received by the sensor coil.

As shown in FIG. 1, the current output circuit 1 includes a pseudo sine wave separation circuit 11 and a voltage-current conversion circuit 12.

(Pseudo Sine Wave Separation Circuit 11)

The pseudo sine wave separation circuit 11 is a circuit for separating a pseudo sine wave (see FIG. 2A) that is externally supplied to an input terminal IN of the current output circuit 1 and is represented by the digital code Din into two analog half-wave signals V1 and V2.

Note that the pseudo sine wave represented by the digital code Din is generated by a counter or the like that periodically reads a sine wave value from a sine wave value table which is prepared in advance. The pseudo sine wave represented by the digital code Din is less influenced by a process variation and the like than a sine wave generated by an analog oscillator is, and thus a stable signal frequency can be easily maintained.

In this embodiment, the digital code Din is data having an n (n is a natural number) bit width. First to n−1th bits of the digital code Din represent absolute values of the digital code Din, and an nth bit (MSB) of the digital code Din represents a code of the digital code Din. Referring to FIG. 2A, when a value of the nth bit is, for example, zero (a period T2 in FIG. 2A), the digital code Din indicates a negative amplitude, while when the value of the nth bit is one (a period T1 in FIG. 2A), the digital code Din indicates a positive amplitude.

The pseudo sine wave separation circuit 11 includes a pseudo sine wave separation unit 110, DA converters 113 and 114 and low-pass filters 115 and 116.

(Pseudo Sine Wave Separation Unit 110)

The pseudo sine wave separation unit (separation circuit) 110 is a unit for separating the pseudo sine wave represented by the digital code Din into two pseudo half-waves (first and second pseudo half-waves) represented by digital signals D1 and D2 and outputting the digital signals D1 and D2.

Specifically, the pseudo sine wave separation unit 110 includes n−1 OR circuits O_1 to O_n−1 and n−1 AND circuits A_1 to A_n−1. The OR circuits O_1 to O_n−1 output a logical OR between the values of the first to the n−1th bits of the digital code Din and the value of the nth bit of the digital code Din as the digital signal D1 (pseudo half-wave). The AND circuits A_1 to A_n−1 output a logical AND between the values of the first to the n−1th bits of the digital code Din and the value of the nth bit of the digital code Din as the digital signal D2 (pseudo half-wave).

When the value of the nth bit of the digital code Din is zero (i.e., when the digital code Din indicates a negative value), the OR circuits O_1 to O_n−1 output the values of the first to n−1th bits of the digital codes Din as the digital signal D1 without any modification. When the value of the nth bit is one (i.e., when the digital code Din indicates a positive value), the OR circuits O_1 to O_n−1 output one as the digital signal D1. That is, the OR circuits O_1 to O_n−1 allow the digital code Din indicating a negative value to pass, while when the digital code Din indicates a value other than the negative value, the OR circuits O_1 to O_n−1 output one as the digital signal D1.

On the other hand, when the value of the nth bit of the digital code Din is zero (i.e., when the digital code Din indicates a negative value), the AND circuits A_1 to A_n−1 output zero as the digital signal D2. When the value of the nth bit is one (i.e., when the digital code Din indicates a positive value), the AND circuits A_1 to A_n−1 output the values of the first to the n−1th bits of the digital code Din as the digital signal D2 without any modification. That is, the AND circuits A_1 to A_n−1 allow the digital code Din indicating a positive value to pass, while when the digital code Din indicates a value other than the positive value, the AND circuits A_1 to A_n-1 output zero as the digital signal D2.

(DA Converters 113 and 114)

The DA converter (DAC; first DA converter) 113 converts the digital signal D1 having the n-1 bit width which is output from the OR circuits O_1 to O_n-1 that are disposed in the pseudo sine wave separation unit 110 into an analog half-wave signal (a first half-wave signal) V1.

Figure 2B:
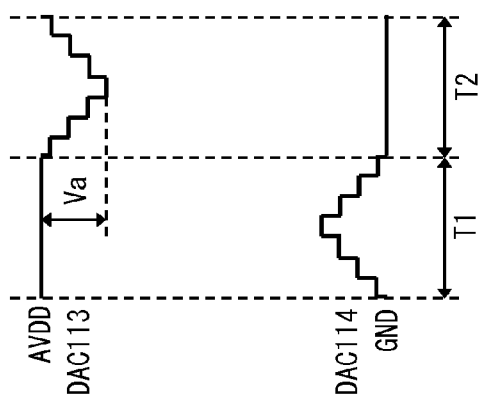

A power supply voltage (a first reference voltage) AVDD, which is a reference value of an output, is supplied to a high-potential power supply terminal of the DA converter 113. A bias voltage (a first bias voltage) Vrb1 for determining an amplitude value of the output is supplied to a low-potential power supply terminal of the DA converter 113. Therefore, the DA converter 113 converts the digital signal D1 (the pseudo half-wave represented by the digital code Din indicating a negative value in the digital code Din) into the analog half-wave signal V1 which is based on the power supply voltage AVDD (see the top drawing of FIG. 2B).

The DA converter (DAC; second DA converter) 114 converts the digital signal D2 having the n-1 bit width which is output from the AND circuits A_1 to A_n-1 that are disposed in the pseudo sine wave separation unit 110 into an analog half-wave signal (a second half-wave signal) V2.

A ground voltage (a second reference voltage) GND, which is a reference value of the output, is supplied to a low-potential power supply terminal of the DA converter 114. A bias voltage (a second bias voltage) Vrt2 for determining an amplitude value of the output is supplied to a high-potential power supply terminal of the DA converter 114. Therefore, the DA converter 114 converts the digital signal D2 (a pseudo half-wave represented by the digital code Din indicating a positive value in the digital code Din) into the analog half-wave signal V2 which is based on the ground voltage GND (see the bottom drawing of FIG. 2B).

(First Specific Configuration Example of DA Converters 113 and 114)

Figure 3:
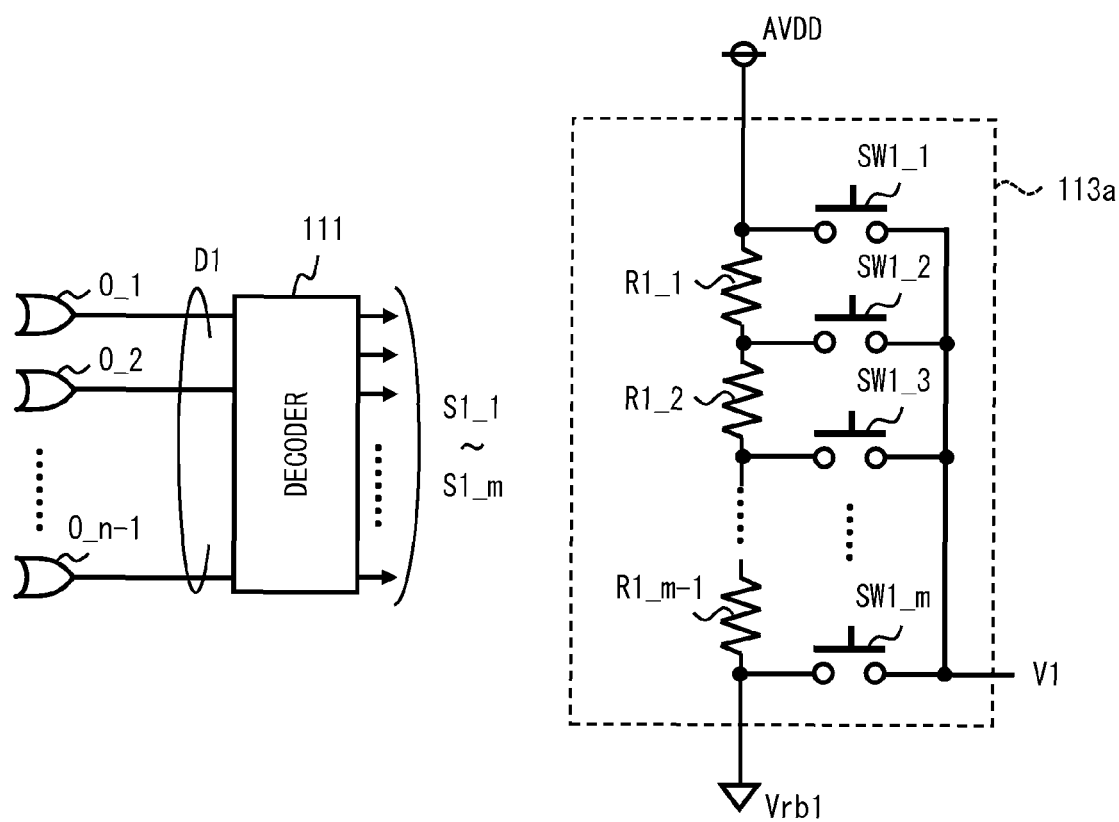
FIG. 3 is a drawing showing a first specific configuration example of one DA converter that is disposed in the current output circuit shown in FIG. 1.
Figure 4:
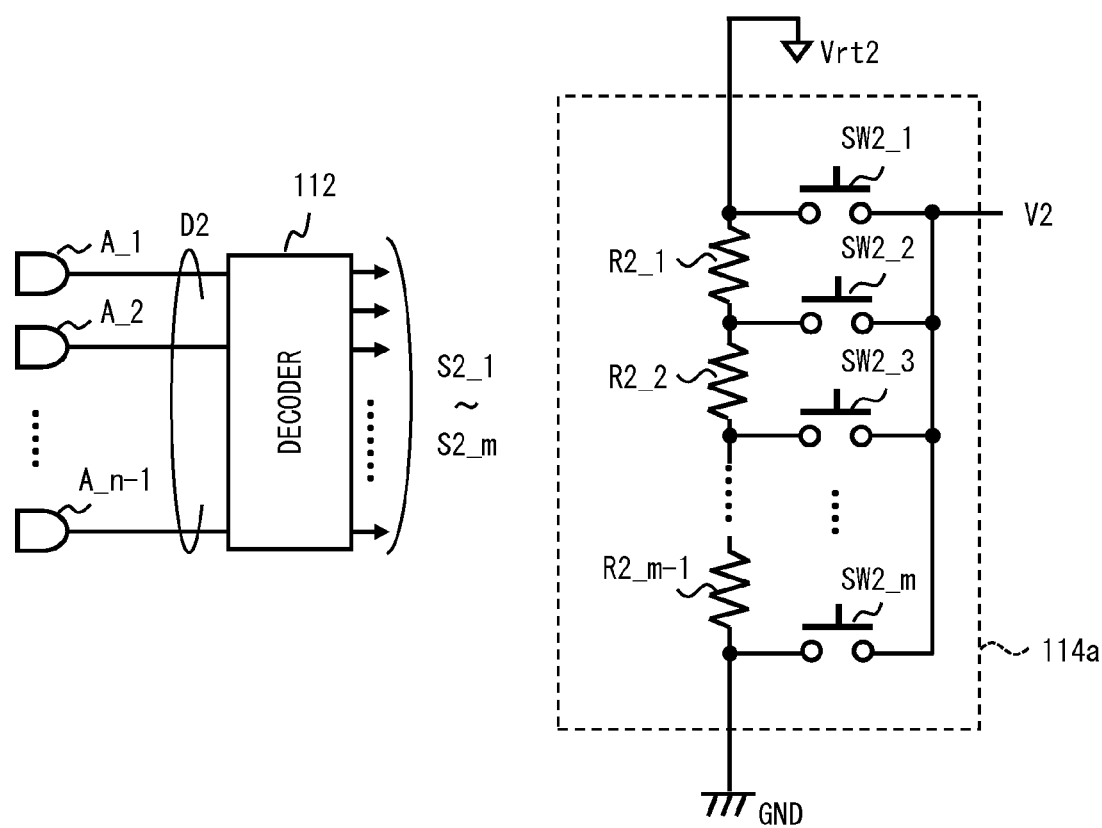
FIG. 4 is a drawing showing the first specific configuration example of the other DA converter that is disposed in the current output circuit shown in FIG. 1.

FIGS. 3 and 4 show DA converters 113a and 114a as a first specific configuration example of the DA converters 113 and 114, respectively. Note that when the DA converters 113a and 114a are used as the DA converters 113 and 114, decoders 111 and 112 are further included in the current output circuit 2.

The decoder 111 decodes the digital signal D1 that is output from the pseudo sine wave separation unit 110 and outputs control signals S1_1 to S1_m (m is 2^(n-1)).

The decoder 112 decodes the digital signal D2 that is output from the pseudo sine wave separation unit 110 and outputs control signals S2_1 to S2_m.

The DA converter 113a is a resistive string DA converter and includes resistive elements R1_1 to R1_m-1 and switch elements SW1_1 to SW1_m. The resistive elements R1_1 to R1_m-1 are disposed in series between a high-potential power supply terminal and a low potential power supply terminal of the DA converter 113a. The switch elements SW1_1 to SW1_m-1 are disposed between one ends of the respective resistive elements R1_1 to R1_m-1 and an output terminal of the DA converter 113a. Further, the switch element SW1_m is disposed between the other end of the resistive element R1_m-1 and the output terminal of the DA converter 113a. One of the switch elements SW1_1 to SW1_m is switched on by the control signals S1_1 to S1_m, while the rest of switch elements are switched off.

The DA converter 114a is a resistive string DA converter and includes resistive elements R2_1 to R2_m-1 and switch elements SW2_1 to SW2_m. The resistive elements R2_1 to R2_m-1 are disposed in series between a high-potential power supply terminal and a low potential power supply terminal of the DA converter 114a. The switch elements SW2_1 to SW2_m-1 are disposed between one ends of the respective resistive elements R2_1 to R2_m-1 and an output terminal of the DA converter 114a. Further, the switch element SW2_m is disposed between the other end of the resistive element R2_m-1 and the output terminal of the DA converter 114a. One of the switch elements SW2_1 to SW2_m is switched on by the control signals S2_1 to S2_m, while the rest of switch elements are switched off.

With the above-mentioned configuration, the DA converters 113a and 114a can convert the pseudo half-waves represented by the digital signals D1 and D2 into the analog half-wave signals V1 and V2 and output the analog half-wave signals V1 and V2, respectively.

(Second Specific Configuration Example of DA Converters 113 and 114).

Figure 5:
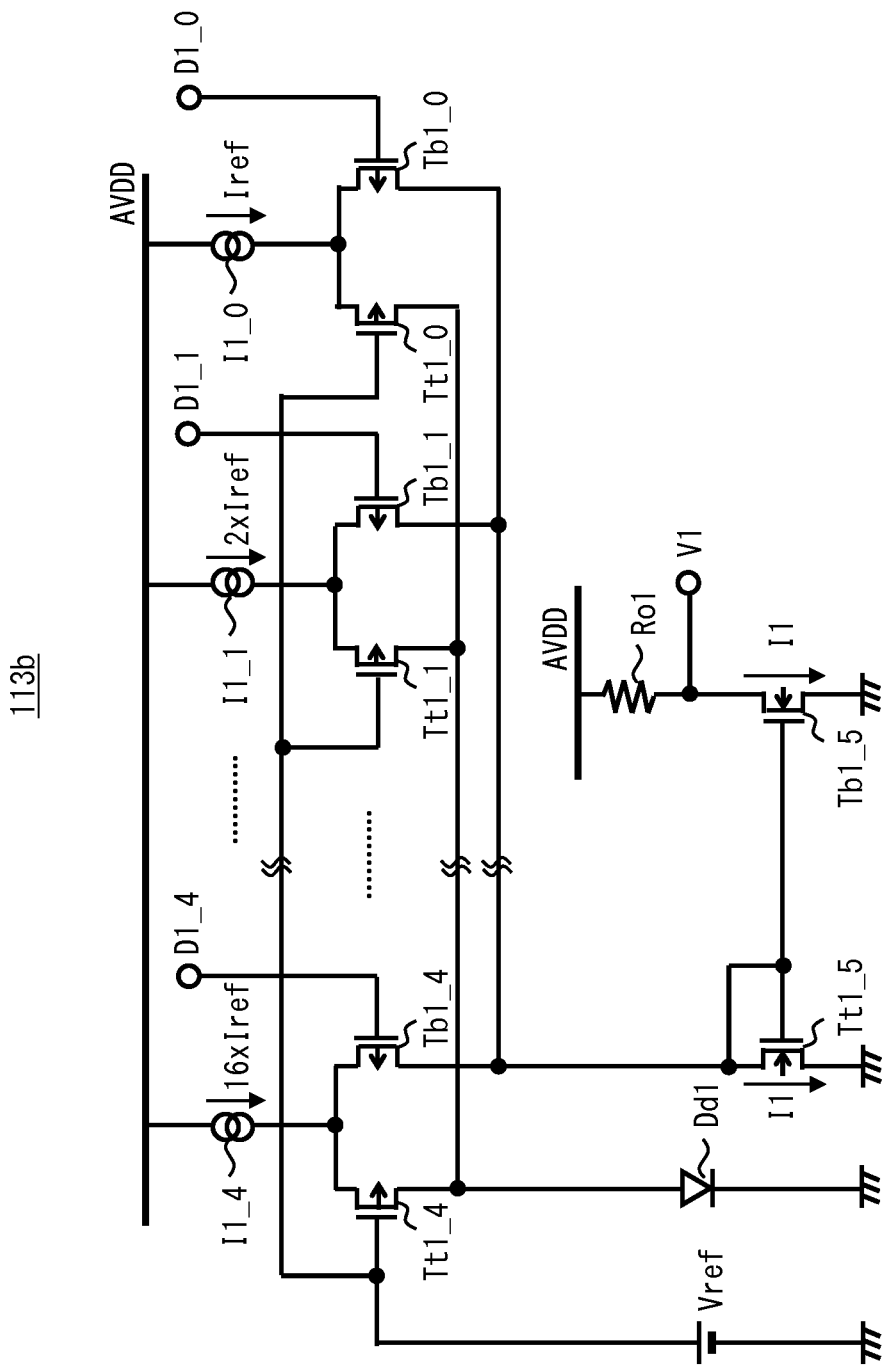
FIG. 5 is a circuit diagram showing a second specific configuration example of one DA converter that is disposed in the current output circuit shown in FIG. 1.
Figure 6:
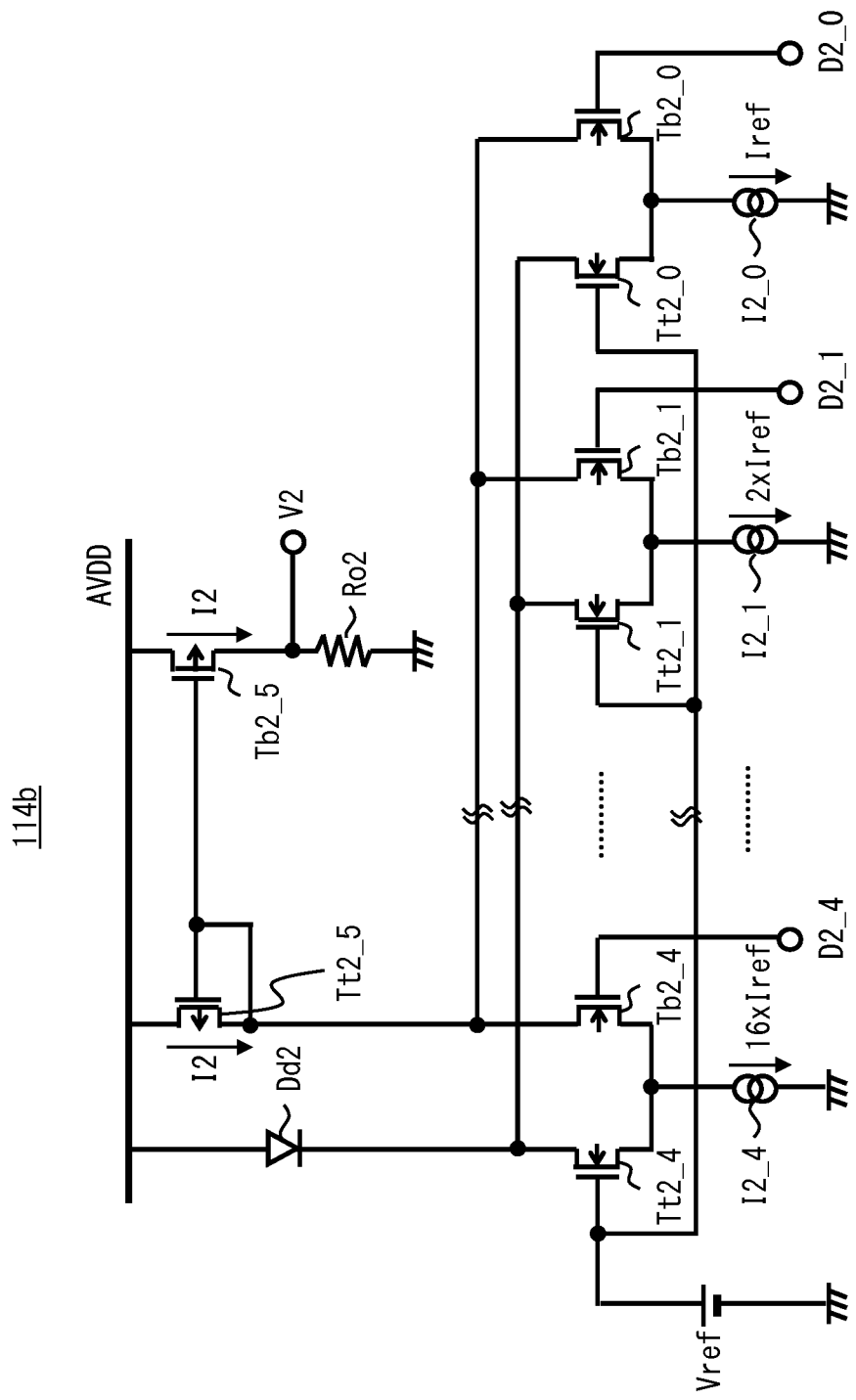
FIG. 6 is a circuit diagram showing the second specific configuration example of the other DA converter that is disposed in the current output circuit shown in FIG. 1.

FIGS. 5 and 6 show DA converters 113b and 114b as a second specific configuration example of the DA converters 113 and 114, respectively. In this example, the DA converter 113b converts digital signals D1_0 to D1_4 having a five bit width into the analog signal V1, and the DA converter 114b converts the digital signals D2_0 to D2_4 having a five bit width into the analog signal V2. Note that the digital signals D1_0 to D1_4 correspond to values of first to fifth bits of the digital signal D1, respectively, and the digital signals D2_0 to D2_4 correspond to values of first to fifth bits of the digital signal D2, respectively.

The DA converter 113b is a current addition DA converter and includes constant current sources I1_0 to I1_4, transistors Tt1_0 to Tt1_5 and Tb1_0 to Tb1_5, a diode Dd1, and a resistive element Ro1. In this example, the transistors Tt1_0 to Tt1_4 and Tb1_0 to Tb1_4 are P-channel MOS transistors, and the transistors Tt1_5 and Tb1_5 are N-channel MOS transistors.

The constant current sources I1_0 to I1_4 are weighted by a power of two. To be specific, currents having current values of Iref, 2×Iref, 4×Iref, 8×Iref, and 16×Iref flow through the constant current sources I1_0 to I1_4, respectively.

The transistors Tt1_0 to Tt1_4 are disposed between the respective constant current sources I1_0 to I1_4 and the anode of the diode Dd1, and a reference voltage Vref (=AVDD/2) is supplied to the gates of the transistors Tt1_0 to Tt1_4. The transistors Tb1_0 to Tb1_4 are disposed between the respective constant current sources I1_0 to I1_4 and the drain of the transistor Tt1_5 and turned on or off based on the digital signals D1_0 to D1_4, respectively. When values of the digital signals D1_0 to D1_4 are one (i.e., the power supply voltage AVDD level), a current flows through the transistors Tt1_0 to Tt1_4, while when the values of the digital signals D1_0 to D1_4 are zero (i.e., the ground voltage GND level), a current flows through the transistors Tb1_0 to Tb1_4.

The transistors Tt1_5 and Tb1_5 constitute a current mirror circuit. In this example, the sizes of the transistors Tt1_5 and Tb1_5 are equivalent. For this reason, a current equivalent to the current flowing between the source and drain of the transistor Tt1_5 flows between the source and drain of the transistor Tb1_5. The resistive element Ro1 converts the current flowing between the source and drain of the transistor Tb1_5 into a voltage and output it as the analog half-wave signal V1.

The DA converter 114*b* is a current addition DA converter and includes constant current sources I2_0 to I2_4, transistors Tt2_0 to Tt2_5 and Tb2_0 to Tb2_5, a diode Dd2, and a resistive element Ro2. In this example, the transistors Tt2_0 to Tt2_4 and Tb2_0 to Tb2_4 are N-channel MOS transistors, and the transistors Tt2_5 and Tb2_5 are P-channel MOS transistors.

The constant current sources I2_0 to I2_4 are weighted by a power of two. To be specific, currents having current values of Iref, 2×Iref, 4×Iref, 8×Iref, and 16×Iref flow through the constant current sources I2_0 to I2_4, respectively.

The transistors Tt2_0 to Tt2_4 are disposed between the respective constant current sources I2_0 to I2_4 and the cathode of the diode Dd2, and the reference voltage Vref (=AVDD/2) is supplied to the gates of the transistors Tt2_0 to Tt2_4. The transistors Tb2_0 to Tb2_4 are disposed between the respective constant current sources I2_0 to I2_4 and the drain of the transistor Tt2_5 and turned on or off based on the digital signals D2_0 to D2_4, respectively. When the values of the digital signals D2_0 to D2_4 are one (i.e., the power supply voltage AVDD level), a current flows through the transistors Tb2_0 to Tb2_4. When the values of the digital signals D2_0 to D2_4 are zero (i.e., the ground voltage GND level), a current flows through the transistors Tt2_0 to Tt2_4.

The transistors Tt2_5 and Tb2_5 constitute a current mirror circuit. In this example, the sizes of the transistors Tt2_5 and Tb2_5 are equivalent. For this reason, a current equivalent to the current flowing between the source and drain of the transistor Tt2_5 flows between the source and drain of the transistor Tb2_5. The resistive element Rot converts the current flowing between the source and drain of the transistor Tb2_5 into a voltage and output it as the analog half-wave signal V2.

With the above-mentioned configuration, the DA converters 113*b* and 114*b* can convert the pseudo half-waves represented by the digital signals D1 and D2 into the analog half-wave signals V1 and V2, respectively, and output the analog half-wave signals V1 and V2.

(Third Specific Configuration Example of DA Converters 113 and 114).

Figure 7:
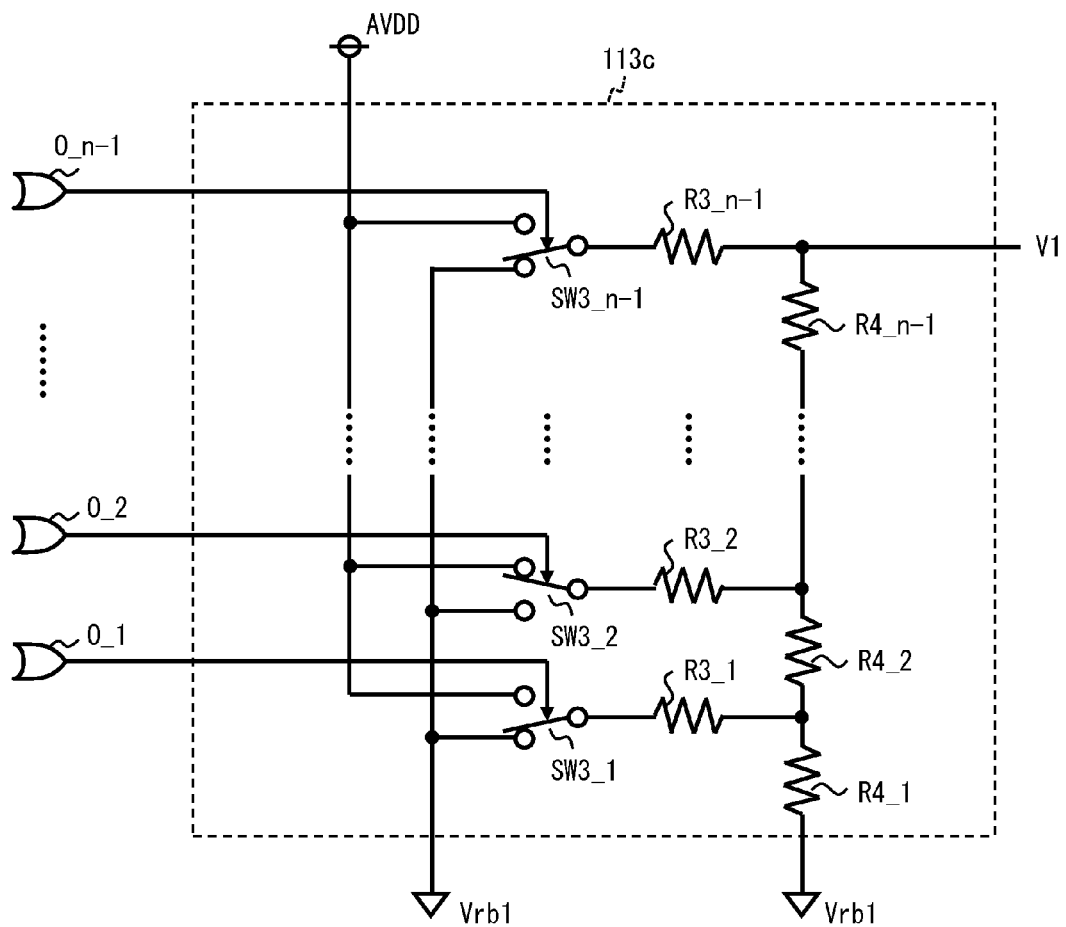
FIG. 7 is a circuit diagram showing a third specific configuration example of one DA converter that is disposed in the current output circuit shown in FIG. 1.
Figure 8:
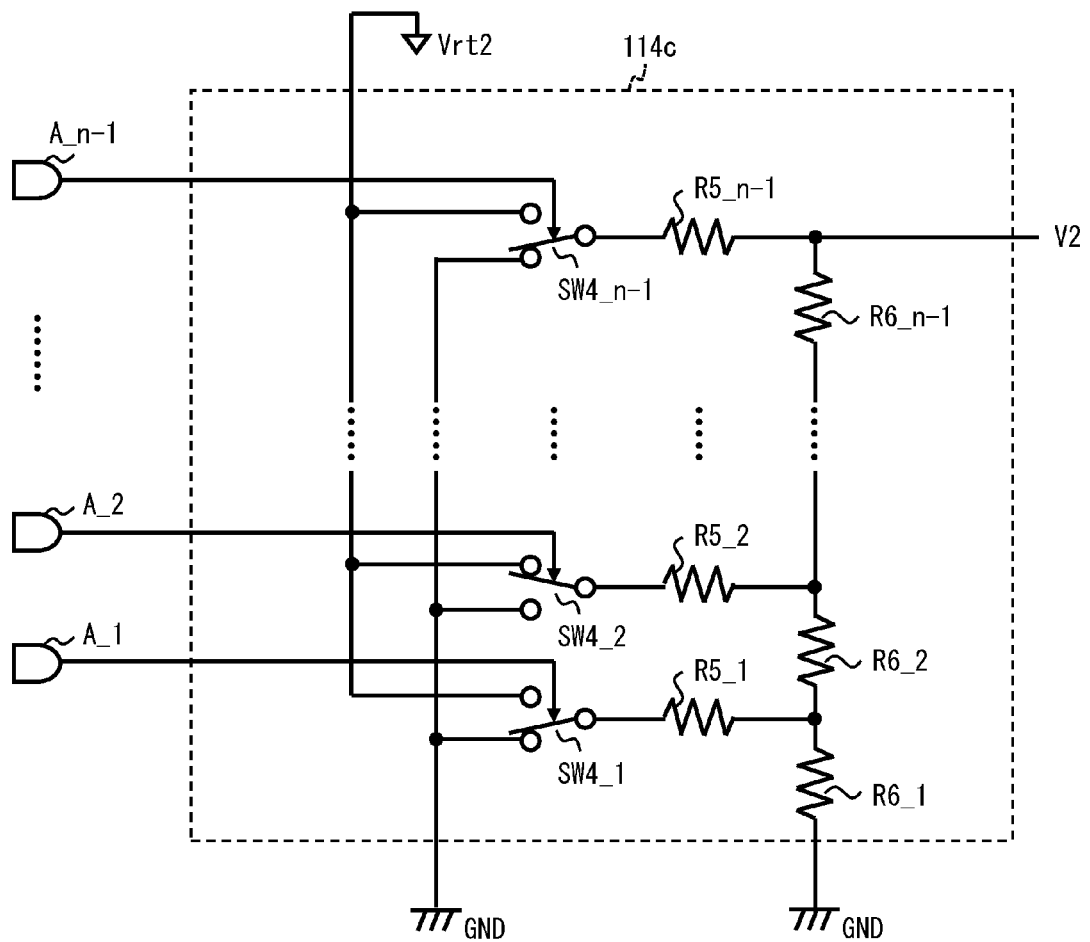
FIG. 8 is a circuit diagram showing the third specific configuration example of the other DA converter that is disposed in the current output circuit shown in FIG. 1.

FIGS. 7 and 8 show DA converters 113*c* and 114*c* as a third specific configuration example of the DA converters 113 and 114, respectively.

The DA converter 113*c* is an R2R resistor ladder DA converter and includes resistive elements R3_1 to R3_*n*−1, resistive elements R4_1 to R4_*n*−1, and switch elements SW3_1 to SW3_*n*−1. Note that resistive values of the resistive elements R3_1 to R3_*n*−1 and R4_1 are substantially twice as great as the resistive values of the resistive elements R4_2 to R4_*n*−1.

The resistive elements R4_1 to R4_*n*−1 are disposed in series between a low potential power supply terminal to which the bias voltage Vrb1 is supplied and an output terminal of the DA converter 113*c*. The resistive elements R3_1 to R3_*n*−1 are disposed between one ends of the respective resistive elements R4_1 to R4_*n*−1 and first terminals of the respective switch elements SW3_1 to SW3_*n*−1. Second terminals of the respective switch elements SW3_1 to SW3_*n*−1 are connected to a high-potential power supply terminal to which the power supply voltage AVDD is supplied. Third terminals of the switch elements SW3_1 to SW3_*n*−1 are connected to a low-potential power supply terminal to which the bias voltage Vrb1 is supplied. The switch elements SW3_1 to SW3_*n*−1 connect either the second or third terminals to the first terminals based on output signals from the OR circuits O_1 to O_n−1.

When the output signals from the OR circuits O_1 to O_n−1 indicate, for example, one, the switch elements SW3_1 to SW3_*n*−1 connect the respective second terminals to which the power supply voltage AVDD is supplied to the first terminals. When the output signals from the OR circuits O_1 to O_n−1 indicate zero, the switch elements SW3_1 to SW3_*n*−1 connect the respective third terminals to which the bias voltage Vrb1 is supplied to the respective first terminals.

The DA converter 114*c* is an R2R resistor ladder DA converter and includes resistive elements R5_1 to R5_*n*−1, resistive elements R6_1 to R6_*n*−1, and switch elements SW4_1 to SW4_*n*−1. Note that resistive values of the resistive elements R5_1 to R5_*n*−1 and R6_1 are substantially twice as great as resistive values of the resistive elements R6_2 to R6_*n*−1.

The resistive elements R6_1 to R6_*n*−1 are disposed in series between a low-potential power supply terminal to which the ground voltage GND is supplied and an output terminal of the DA converter 114*c*. The resistive elements R5_1 to R5_*n*−1 are disposed between one ends of the respective resistive elements R6_1 to R6_*n*−1 and first terminals of the respective switch elements SW4_1 to SW4_*n*−1. Second terminals of the respective switch elements SW4_1 to SW4_*n*−1 are connected to a high-potential power supply terminal to which the bias voltage Vrt2 is supplied. Third terminals of the switch elements SW4_1 to SW4_*n*−1 are connected to the low-potential power supply terminal to which the ground voltage GND is supplied. The switch elements SW4_1 to SW4_*n*−1 connect either the second or third terminals to the first terminals based on output signals from the AND circuits A_1 to A_n−1.

When the output signals from the AND circuits A_1 to A_n−1 indicate, for example, one, the switch elements SW4_1 to SW4_*n*−1 connect the respective second terminals to which the bias voltage Vrt2 is supplied to the first terminals. When the output signals from the AND circuits A_1 to A_n−1 indicate zero, the switch elements SW4_1 to SW4_*n*−1 connect the respective third terminals to which the ground voltage GND is supplied to the respective first terminals.

With the above-mentioned configuration, the DA converters 113*c* and 114*c* can convert the pseudo half-waves represented by the digital signals D1 and D2 into the analog half-wave signals V1 and V2 and output the analog half-wave signals V1 and V2, respectively.

(Low-Pass Filters 115 and 116)

Figure 2C:
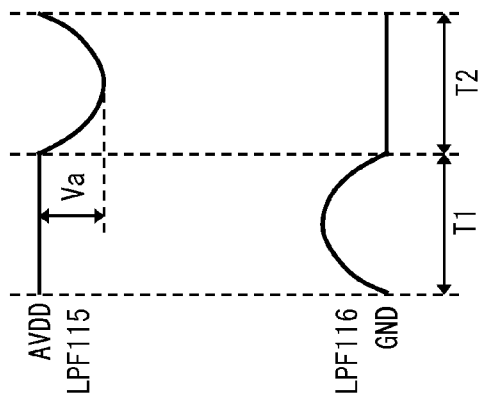

The low-pass filter (LPF; first low-pass filter) 115 smooths the analog half-wave signal V1 that is output from the DA converter 113 (see the top drawing of FIG. 2C). Further, the low-pass filter (LPF; second low-pass filter) 116 smooths the analog half-wave signal V2 that is output from the DA converter 114 (see the bottom drawing of FIG. 2C).

(Voltage-Current Conversion Circuit 12)

The voltage-current conversion circuit 12 converts voltages of the analog half-wave signals V1 and V2 which are output from the pseudo sine wave separation circuit 11 into currents, combines the currents, and outputs the combined current as a current Iout.

The voltage-current conversion circuit 12 includes VI amplifiers (first and second amplifiers) 121 and 122, driver transistors (first and second driver transistors) Tr1 and Tr2, and resistive elements (third and fourth resistive elements) R1 and R2. The driver transistor Tr1 is, for example, a P-channel MOS transistor. The driver transistor Tr2 is, for example, an N-channel MOS transistor.

One end of the resistive element R1 is connected to the power supply voltage terminal (hereinafter referred to as a power supply voltage terminal AVDD) to which the power supply voltage AVDD is supplied, while the other end of the resistive element R1 is connected to the source of the driver transistor Tr1. The drain of the driver transistor Tr1 is connected to an output terminal OUT of the voltage-current conversion circuit 12. The VI amplifier 121 amplifies a potential difference between the output voltage V1 from the pseudo sine wave separation circuit 11 and a source voltage of the driver transistor Tr1 and supplies the amplified potential difference to the gate of the driver transistor Tr1.

The VI amplifier 121 controls a gate voltage of the driver transistor Tr1 so that the source voltage of the driver transistor Tr1 will be the same value as that of the output voltage V1 from the pseudo sine wave separation circuit 11. In this manner, a current corresponding to a potential difference between the power supply voltage AVDD and the output voltage V1 from the pseudo sine wave separation circuit 11 and the resistive value of the resistive element R1 flows between the source and drain of the driver transistor Tr1.

One end of the resistive element R2 is connected to a ground voltage terminal (hereinafter referred to as a ground voltage terminal GND) to which the ground voltage GND is supplied, and the other end of the resistive element R2 is connected to the source of the driver transistor Tr2. The drain of the driver transistor Tr2 is connected to the output terminal OUT of the voltage-current conversion circuit 12. The VI amplifier 122 amplifies a potential difference between an output voltage V2 of the pseudo sine wave separation circuit 11 and a source voltage of the driver transistor Tr2 and supplies the amplified potential difference to the gate of the driver transistor Tr2.

The VI amplifier 122 controls a gate voltage of the driver transistor Tr2 so that the source voltage of the driver transistor Tr2 will be the same value as that of the output voltage V2 of the pseudo sine wave separation circuit 11. In this manner, a current corresponding to a potential difference between the output voltage V2 of the pseudo sine wave separation circuit 11 and the ground voltage GND and the resistive value of the resistive element R2 flows between the source and drain of the driver transistor Tr2.

Figure 2D:
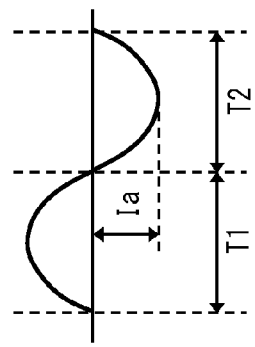

Thus, the voltage-current conversion circuit 12 outputs the current Iout, which is a current obtained by combining the currents flowing through the resistive elements R1 and R2, from the output terminal OUT (see FIG. 2D).

Hereinafter, a zero peak value Ia of the output current Iout from the current output circuit 1 shall be explained in more detail. The zero peak value Ia of the output current Iout is determined by an amplitude value Va of the half-wave signals V1 and V2 which are output from the pseudo sine wave separation circuit 11 and the resistive values of the resistive elements R1 and R2.

Firstly, a current generated by an upper path (a path passing through the DA converter 113→the low-pass filter 115→the VI amplifier 121→the driver transistor Tr1) shall be explained by referring to FIGS. 1, 2, and 9.

In the period T1 in which the value of the nth bit (MSB) of the digital code Din indicates one, values of first to n−1th bits (an input code of the DA converter 113) that constitutes the digital signal D1 indicate all one. Therefore, the DA converter 113 outputs the half-wave signal V1 indicating the power supply voltage AVDD. As the power supply voltage AVDD is supplied to the VI amplifier 121, the power supply voltage AVDD is applied to both of the ends of the resistive element R1 by a virtual short. As a current will not flow through the resistive element R1 at this time, a current flowing between the source and drain of the driver transistor Tr1 is zero.

On the other hand, in the period T2 in which the value of the nth bit (MSB) of the digital code Din indicates zero, the values of the first to n−1th bits (the input code of the DA converter 113) that constitutes the digital signal D1 indicate values corresponding to the digital code Din. Therefore, the DA converter 113 outputs the half-wave signal V1 having an amplitude Va (=AVDD−Vrb1). As the half-wave signal V1 having the amplitude Va is supplied to the VI amplifier 121, a voltage of the amplitude Va is applied to the other end of the resistive element R1 (an end of the resistive element R1 which is connected to the source of the driver transistor Tr1) by a virtual short. Specifically, the voltage Vrb1(=AVDD−Va=AVDD−(AVDD−Vrb1)) is applied to both of the ends of the resistive element R1. Thus, a current expressed by Vrb1/R1 flows between the source and drain of the driver transistor Tr1.

Next, the current Ia that is generated by a lower path (a path passing through the DA converter 114→the low-pass filter 116→the VI amplifier 122→the driver transistor Tr2) shall be explained by referring to FIGS. 1, 2, and 10.

In the period T2 in which the value of the nth bit (MSB) of the digital code Din indicates zero, values of the first to n−1th bits (an input code of the DA converter 114) that constitutes the digital signal D2 indicate all zero. Therefore, the DA converter 114 outputs the half-wave signal V2 indicating the ground voltage GND. As the ground voltage GND is supplied to the VI amplifier 122, the ground voltage GND is applied to both of the ends of the resistive element R2 by a virtual short. As a current will not flow through the resistive element R2 at this time, a current flowing between the source and drain of the driver transistor Tr2 is zero.

On the other hand, in the period T1 in which the value of the nth bit (MSB) of the digital code Din indicates one, the values of the first to n−1th bits (the input code of the DA converter 114) that constitutes the digital signal D2 indicate values corresponding to the digital code Din. Therefore, the DA converter 114 outputs the half-wave signal V2 having the amplitude Va(=Vrt2+GND). As the half-wave signal V2 having the amplitude Va is supplied to the VI amplifier 122, a voltage of the amplitude Va is applied to the other end of the resistive element R2 (an end of the resistive element R2 which is connected to the source of the driver transistor Tr2) by a virtual short. Specifically, a voltage Vrt2 (=Va−GND=(Vrt2+GND)−GND) is applied to both of the ends of the resistive element R2. Therefore, a current expressed by Vrt2/R2 flows between the source and drain of the driver transistor Tr2.

Thus, the voltage-current conversion circuit 12 outputs the current Iout expressed by Vrt2/R2 in the period T1 and outputs the current Iout expressed by Vrb1/R1 in the period T2. In sum, the zero peak value Ia of the output current Iout is determined by the amplitude value Va of the half-wave signals V1 and V2 and the resistive values of the resistive elements R1 and R2.

As described above, the current output circuit 1 according to this embodiment separates the digital pseudo sine wave into two pseudo half-waves, converts the pseudo half-waves into analog half-wave signals, converts the voltages of the analog half-wave signals into currents, combines the currents, and outputs the combined current as the analog sine wave signal Iout. Accordingly, it is unnecessary for the current output circuit 1 according to this embodiment to include a large-scale analog circuit such as a gain adjusting circuit and a separation circuit for the analog sine wave. It is thus possible for the circuit size and the current consumption of the current output circuit 1 of this embodiment to be reduced more than they can be reduced when the digital pseudo sine wave is converted into the analog sine wave, and then the analog sine wave is separated into two halfwaves.

(Modified Example of Current Output Circuit 1)

Figure 11:
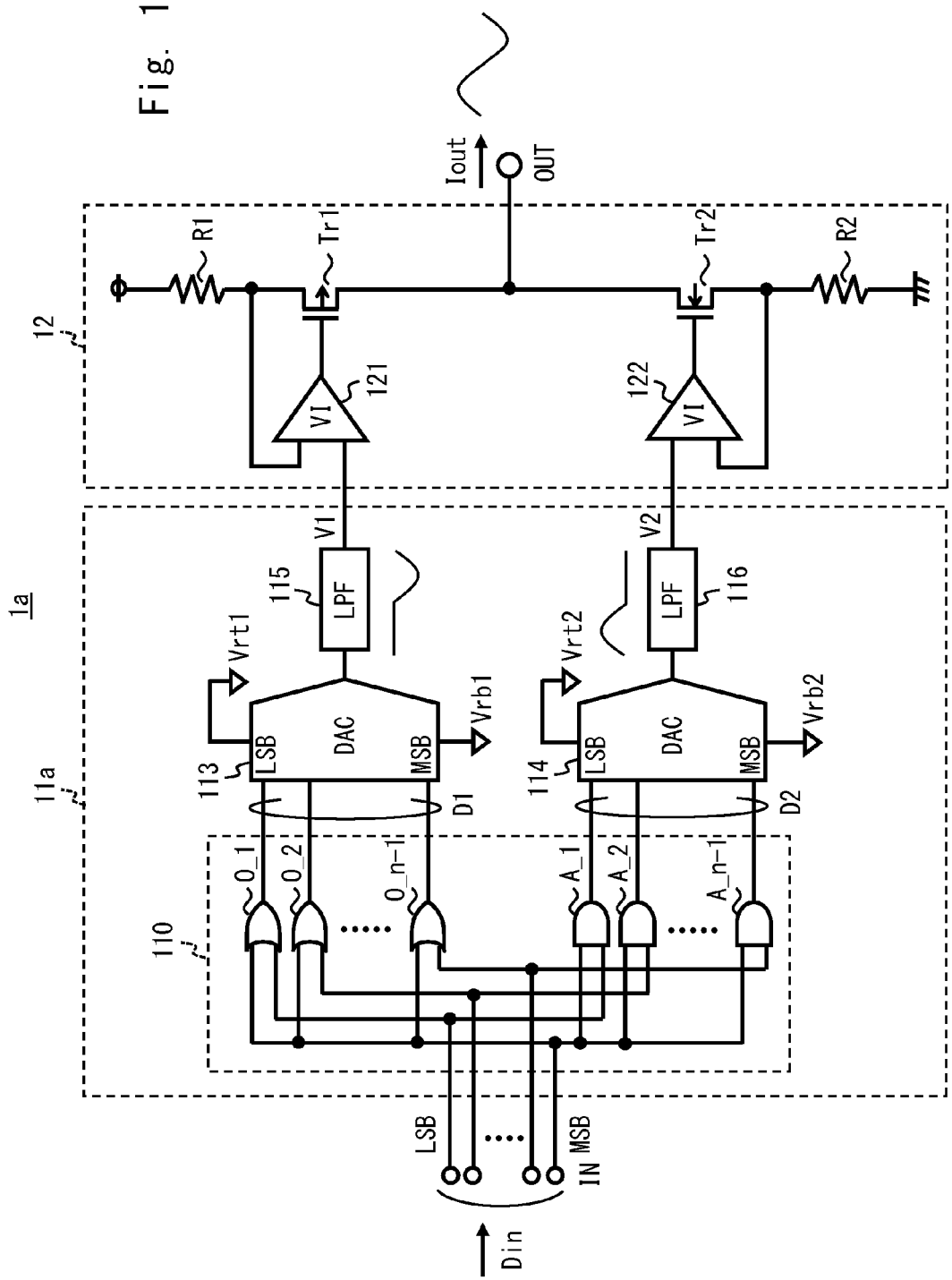
FIG. 11 is a drawing showing a modified example of the current output circuit according to the first embodiment.

FIG. 11 is a drawing showing a current output circuit 1a as a modified example of the current output circuit 1. The current output circuit 1a includes a pseudo sine wave separation circuit 11a in place of the pseudo sine wave separation circuit 11.

In the pseudo sine wave separation circuit 11a, a bias voltage Vrt1, which is a reference value of an output, is supplied to the high-potential power supply terminal of the DA converter 113, and the bias voltage Vrb1 for determining an amplitude value of the output is supplied to the low-potential power supply terminal of the DA converter 113. Further, a bias voltage Vrt2 for determining an amplitude value of the output is supplied to the high-potential power supply terminal of the DA converter 114, and a bias voltage Vrb2 which will be a reference value of the output is supplied to the low-potential power supply terminal of the DA converter 114. At this time, the bias voltages Vrt1, Vrb1, Vrt2, and Vrb2 need to be adjusted so as to satisfy the following expression (1).

$$Vrt1-Vrb1=Vrt2-Vrb2 \quad (1)$$

In this manner, the current output circuit 1a can supply an arbitrary bias voltage to the high-potential power supply terminals and the low-potential power supply terminals of the DA converters 113 and 114.

Second Embodiment

Figure 12:
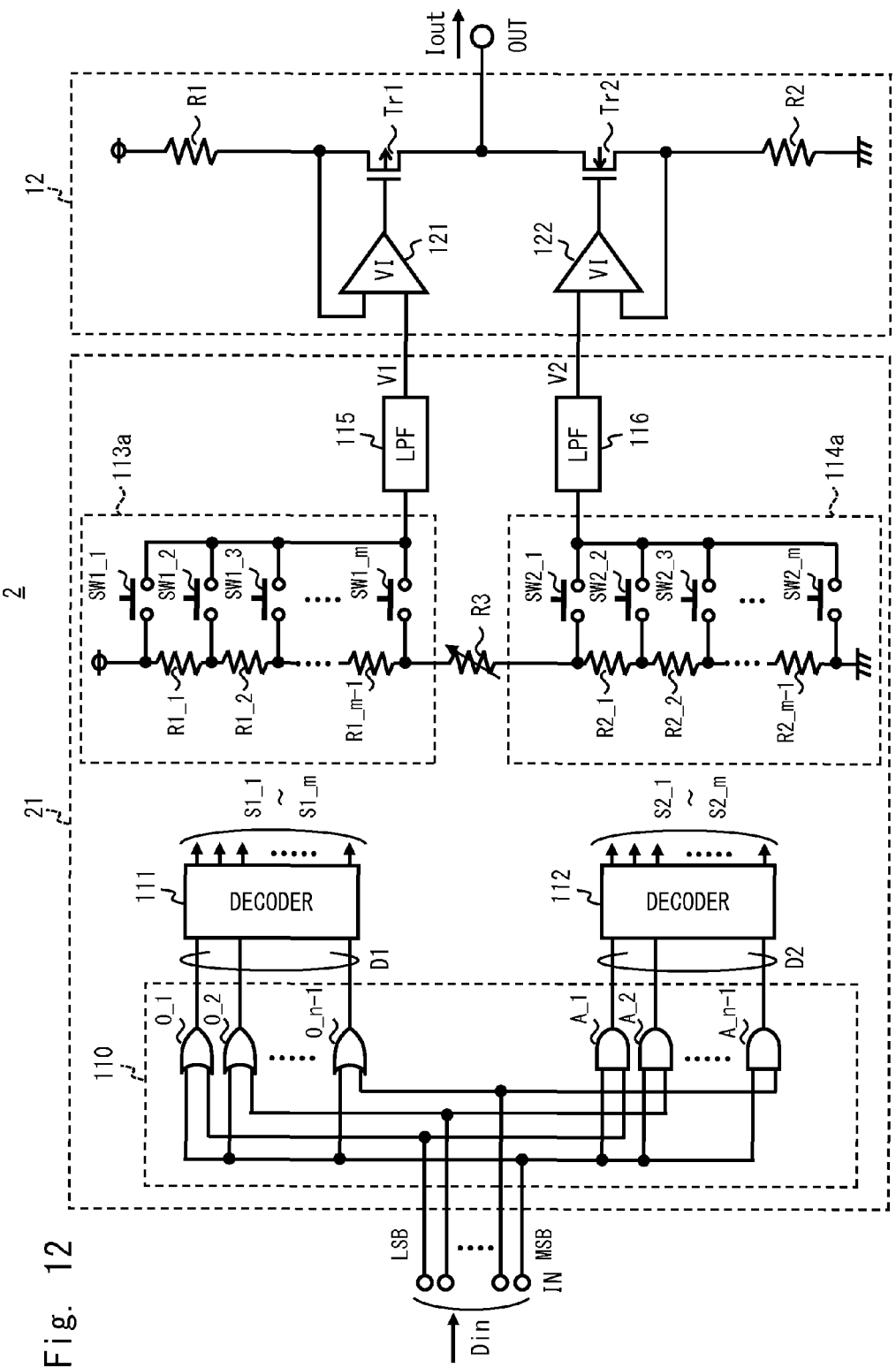
FIG. 12 is a drawing showing a configuration example of a current output circuit according to a second embodiment.

FIG. 12 is a drawing showing a configuration example of a current output circuit 2 according to a second embodiment. The current output circuit 2 and the current output circuit 1 have the same configuration except that the former includes a pseudo sine wave separation circuit 21 in place of the pseudo sine wave separation circuit 11 that is included in the current output circuit 1. The pseudo sine wave separation circuit 21 further includes a variable resistive element R3 for varying the bias voltage that determines the amplitude value Va of the outputs from the DA converters 113 and 114.

Note that in FIG. 12, the resistive string DA converters 113a and 114a are disposed as a specific configuration example of the DA converters 113 and 114, respectively. In addition, the decoders 111 and 112 are further included in the pseudo sine wave separation circuit 21. The details of the decoders 111 and 112 and the DA converters 113a and 114a have already been described.

One end of the variable resistive element R3 is connected to a low-potential power supply terminal of the DA converter 113c (the other end of the resistive element R1_m−1), and the other end of the variable resistive element R3 is connected to a high-potential power supply terminal of the DA converter 114c (one end of the resistive element R2_1).

The bias voltage for determining the amplitude value Va of the outputs from the DA converters 113a and 114a can be changed by adjusting a resistive value of the variable resistive element R3. This enables the DA converters 113a and 114a to change the amplitude value Va of the outputs (pseudo half-waves).

Figure 13:
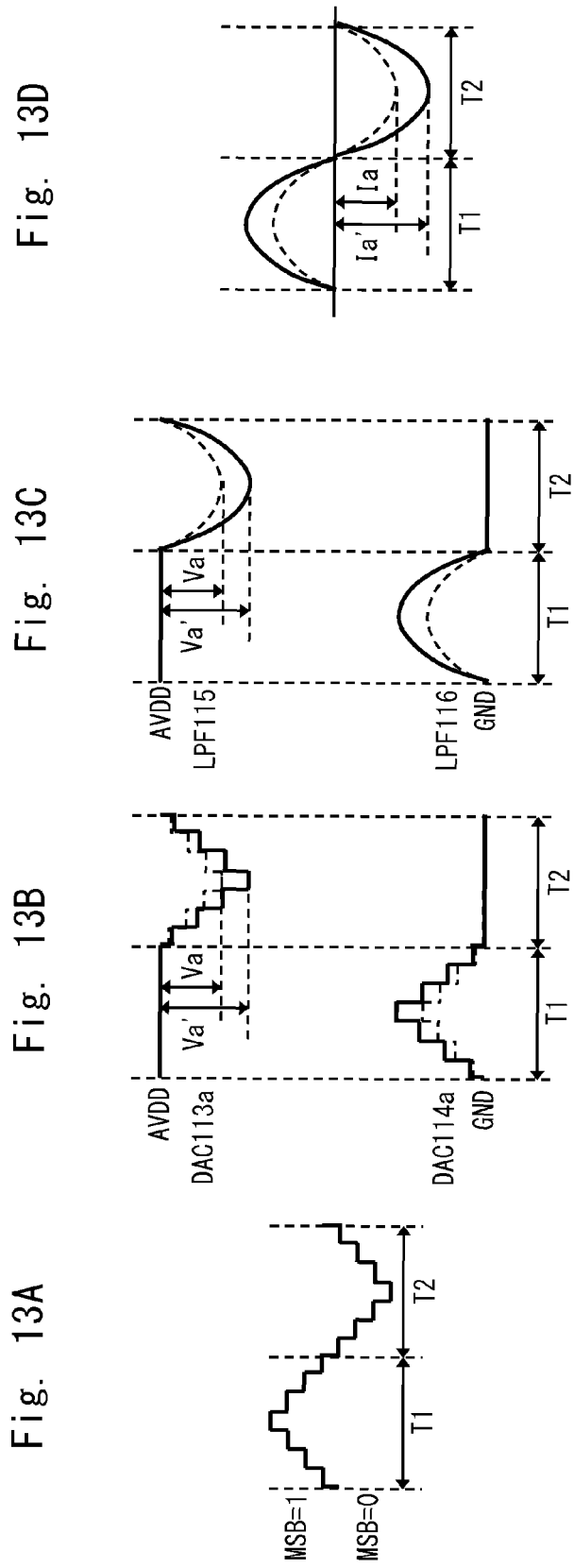
FIGS. 13A to 13D are drawings showing output waveforms of components that are disposed in the current output circuit shown in FIG. 12.

When the resistive value of the variable resistive element R3 is, for example, reduced, the amplitude value (the zero peak value) Va of the outputs from the DA converters 113a and 114a will increase (an amplitude Va' in FIG. 13B). The zero peak value Ia of the output current Iout from the current output circuit 2 is determined by the amplitude value Va of the half-wave signals V1 and V2 which are output from the pseudo sine wave separation circuit 11a and the resistive values of the resistive elements R1 and R2. Thus, when the amplitude value Va increases, the zero peak value Ia of the output current Iout will also increase (a zero peak value Ia' in FIG. 13D).

Note that as the amplitude value Va of the outputs from the DA converters 113a and 114a that are disposed in the pseudo sine wave separation circuit 21 is determined by a resistive voltage dividing ratio of the plurality of resistive elements that are connected in series via the variable resistive element R3, there is less chance of an error being caused due to the process variation. Accordingly, the current output circuit 2 can reduce an error of the amplitude value Ia of the output current Iout (more specifically, an offset from the center of a current waveform of the output current Iout).

As described so far, the current output circuit 2 according to this embodiment separates the digital pseudo sine wave into two pseudo sine waves, converts the pseudo half-waves into the analog half-wave signals, converts the voltages of the analog half-wave signals into currents, combines the currents, and outputs the combined current as the analog sine wave signal Iout. Accordingly, it is unnecessary for the current output circuit 2 to include a large-scale analog circuit such as a gain adjusting circuit and a separation circuit for the analog sine wave. It is thus possible for the circuit size and current consumption of the current output circuit 2 to be reduced more than they can be reduced when the digital pseudo sine wave is converted into the analog sine wave, and then the analog sine wave is separated into two halfwaves.

Further, the current output circuit 2 according to this embodiment varies the bias voltages Vrb1 and Vrt2 of the respective DA converters 113a and 114a using the variable resistive element R3. This enables the current output circuit 2 to change the amplitude value Ia of the output current Iout depending on the usage.

Although this embodiment explained an example in which the variable resistive element R3 is common to the DA converters 113a and 114a, the present invention is not limited to this, and variable resistive elements may be disposed individually in the DA converters 113a and 114a.

Although this embodiment explained an example in which the resistive string DA converters 113a and 114a are disposed as the specific configuration example of the DA converters 113 and 114, respectively, the present invention is not limited to this. The R2R resistor ladder DA converters 113c and 114c or current addition DA converters may be disposed as specific configuration examples of the DA converters 113 and 114, respectively. A configuration of the current addition DA converter shall be explained as follows.

(Current Output DA Converters 213a and 214a)

Figure 14:
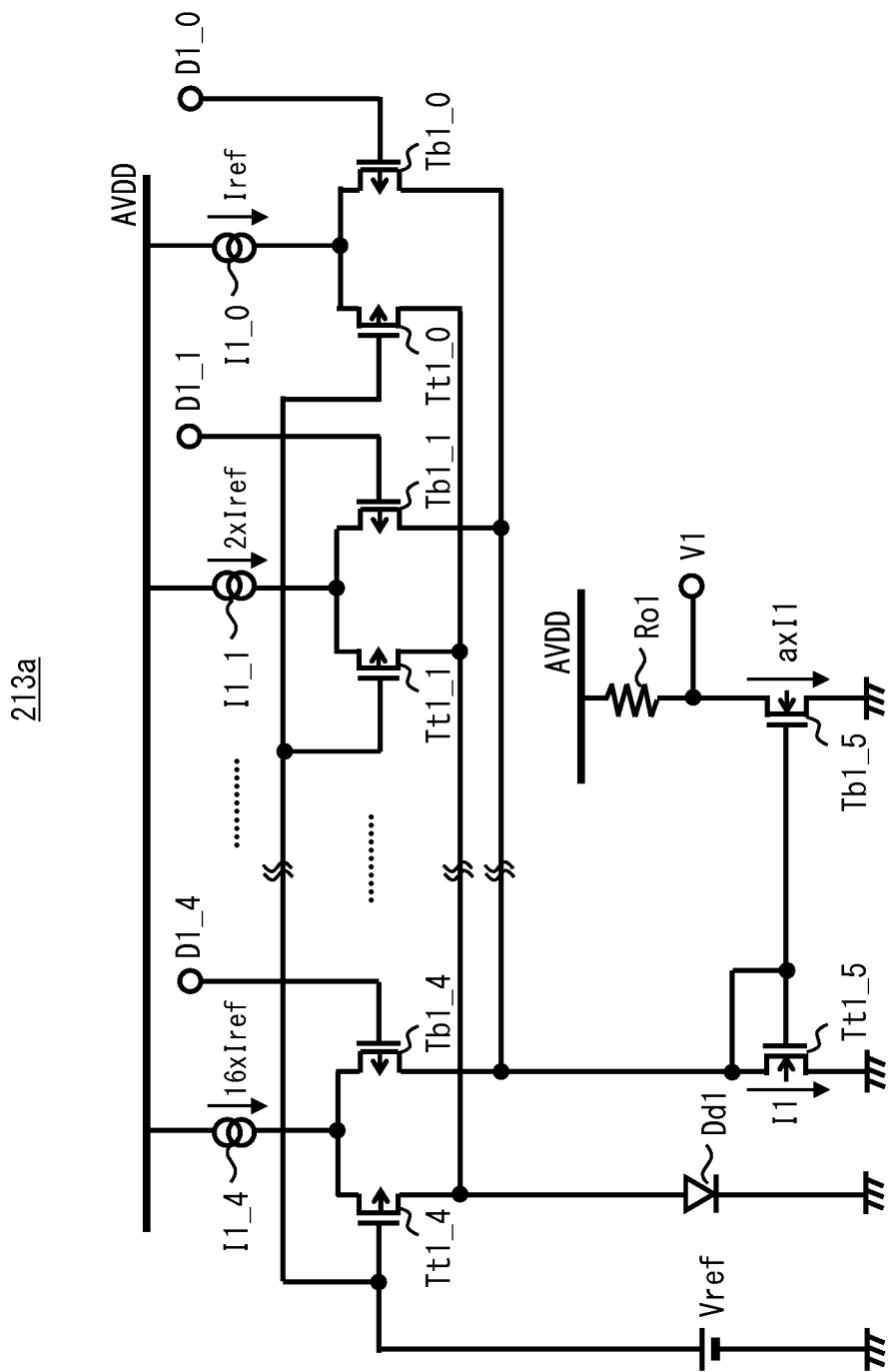
FIG. 14 is a drawing showing a specific configuration example of one DA converter that is disposed in the current output circuit shown in FIG. 12.
Figure 15:
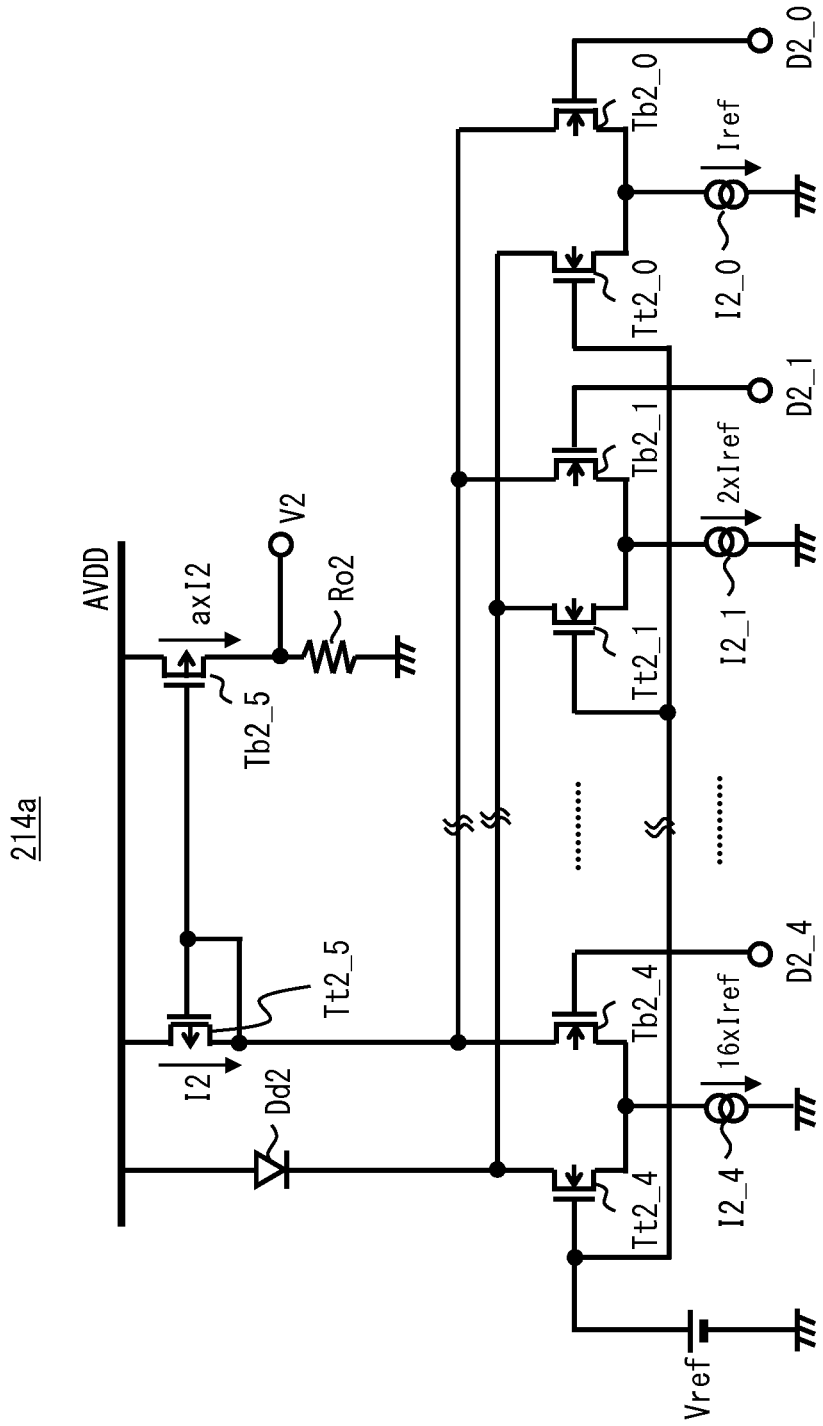
FIG. 15 is a drawing showing a specific configuration example of the other DA converter that is disposed in the current output circuit shown in FIG. 12.

FIGS. 14 and 15 are drawings showing current addition type converters 213a and 214a as a specific configuration example of the DAC converters 113 and 114, respectively.

A basic configuration of the DA converter 213a is the same as that of the DA converter 113b. However, in the DA converter 213a, a size ratio of the transistors Tt1_5 and Tb1_5 that constitute the current mirror circuit is different from that of the transistors constituting the current mirror circuit in the DA converter 113b. Thus, a current a×I1 which is a times as great as the current I1 flowing between the source and drain of the transistor Tt1_5 flows between, for example, the source and drain of the transistor Tb1_5. The amplitude Va of the half-wave signal V1 that is output from the DA converter 213a is determined by the current a×I1 flowing between the source and drain of the transistor Tb1_5 and the resistive value of the resistive element Ro1. Thus, the amplitude Va of the half-wave signal V1 can be arbitrarily adjusted by adjusting the size ratio of the transistors Tt1_5 and Tb1_5.

A basic configuration of the DA converter 214a is the same as that of the DA converter 114b. However, in the DA converter 214a, a size ratio of the transistors Tt2_5 and Tb2_5 that constitute the current mirror circuit is different from that of the transistors constituting the current mirror circuit in the DA converter 114b. Thus, a current a×I2 which is a times as great as the current I2 flowing between the source and drain of the transistor Tt2_5 flows between, for example, the source and drain of the transistor Tb2_5. The amplitude Va of the half-wave signal V2 that is output from the DA converter 214a is determined by the current a×I2 flowing between the source and drain of the transistor Tb2_5 and the resistive value of the resistive element Ro2. Thus, the amplitude Va of the half-wave signal V2 can be arbitrarily adjusted by adjusting the size ratio of the transistors Tt2_5 and Tb2_5.

Note that instead of adjusting the size ratio of the transistors that constitute the current mirror circuit, the current values of the constant current sources may be adjusted, or the resistive values of the resistive elements Ro1 and Ro2 may be varied. However, by adjusting the size ratio of the transistors constituting the current mirror circuit, the current consumption can be reduced more effectively than it can be reduced when the current values of the constant current sources are adjusted. Additionally, by adjusting the size ratio of the transistors constituting the current mirror circuit, an increase in the error caused by an insertion of switches can be prevented unlike when the resistive values of the resistive elements Ro1 and Ro2 are varied.

Third Embodiment

Figure 16:
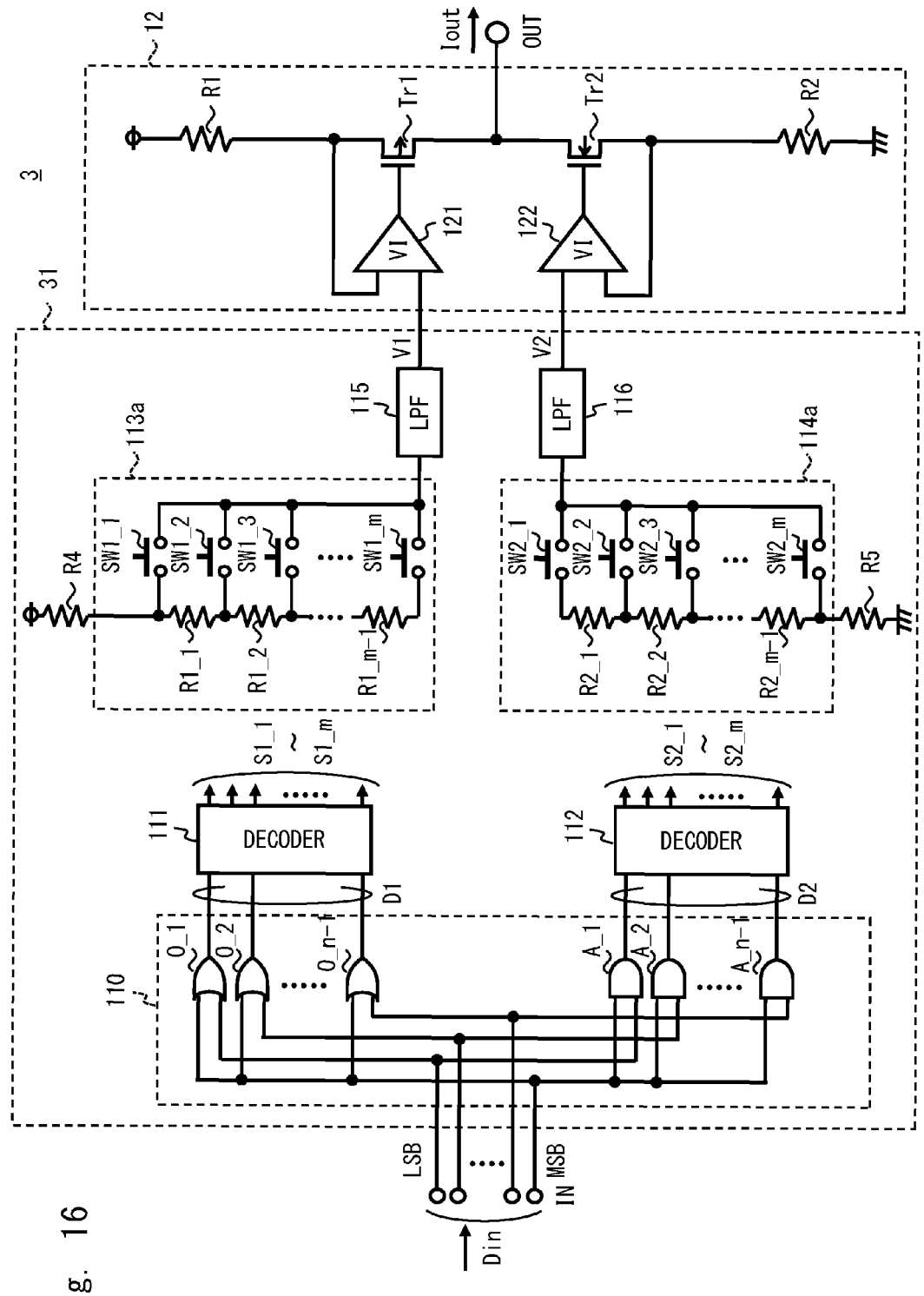
FIG. 16 is a drawing showing a configuration example of a current output circuit according to a third embodiment.

FIG. 16 is a drawing showing a configuration example of a current output circuit 3 according to a third embodiment. The current output circuit 3 and the current output circuit 1 have the same configuration except that the former includes a pseudo sine wave separation circuit 31 in place of the pseudo sine wave separation circuit 11 that is included in the current output circuit 1. The pseudo sine wave separation circuit 31 further includes resistive elements (first and second resistive elements) R4 and R5 for setting an idling voltage Vi for the reference voltages (AVDD and GND) that determine reference values of the outputs from the DA converter 113 and 114.

Note that in FIG. 16, the resistive string DA converters 113a and 114a are disposed as a specific configuration example of the DA converters 113 and 114, respectively. In addition, the decoders 111 and 112 are further included in the current output circuit 3. The details of the decoders 111 and 112 and the DA converters 113a and 114a have already been described.

The resistive element R4 is disposed between the power supply voltage terminal AVDD and the high-potential power supply terminal of the DA converter 213 (one end of the resistive element R1_1). The resistive element R5 is disposed between the ground voltage terminal GND and the low-potential power supply terminal of the DA converter 214 (the other end of the resistive element R2_m-1).

Figure 17:
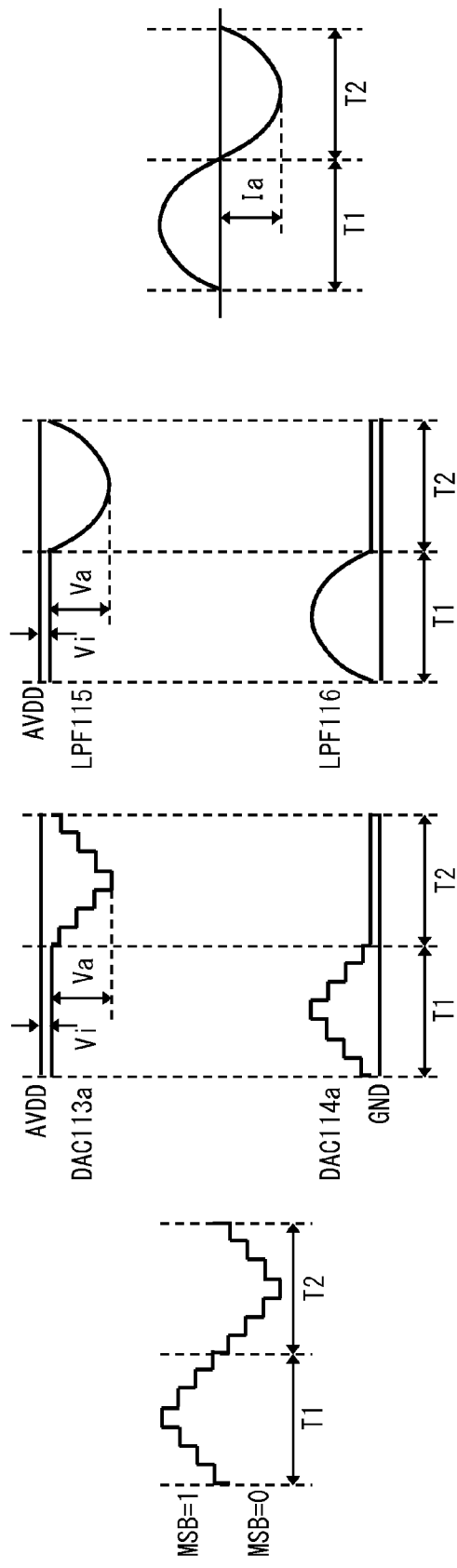
FIGS. 17A to 17D are drawings showing output waveforms of components that are disposed in the current output circuit shown in FIG. 16.

Therefore, the reference value of the half-wave signal V1 that is output from the DA converter 113a indicates a voltage value that that is lower than the power supply voltage AVDD by the idling voltage Vi, and the reference value of the half-wave signal V2 that is output from the DA converter 114a is greater than the ground voltage GND by the idling voltage Vi (see FIG. 17B).

As the idling voltage Vi is always applied on the resistive elements R1 and R2, a current corresponding to the idling voltage Vi (idling current) always flows between the sources and drains of the driver transistors Tr1 and Tr2. This prevents a rapid increase in the resistive value of the sources-drains of the driver transistors Tr1 and Tr2, in which the rapid increase is caused by the current flowing between the sources and drains of the driver transistors Tr1 and Tr2 becoming zero. Consequently, the current output circuit 3 can reduce a distortion generated when the value of the output current Iout becomes zero.

As described so far, the current output circuit 3 according to this embodiment separates the digital pseudo sine wave into two pseudo sine waves, converts the pseudo half-waves into the analog half-wave signals, converts the voltages of the analog half-wave signals into currents, combines the currents, and outputs the combined current as the analog sine wave signal Iout. Accordingly, it is unnecessary for the current output circuit 3 to include a large-scale analog circuit such as a gain adjusting circuit and a separation circuit for the analog sine wave. It is thus possible for the circuit size and current consumption of the current output circuit 3 to be reduced the circuit size and the current consumption more than they can be reduced when the digital pseudo sine wave is converted into the analog sine wave, and then the analog sine wave is separated into two half-waves.

Additionally, the current output circuit 3 according to this embodiment uses the resistive elements R4 and R5 to set the idling voltage Vi to the reference voltages AVDD and GND of the respective DA converters 113a and 114a. This enables the current output circuit 3 to reduce the distortion generated when the value of the output current Iout becomes zero.

Although this embodiment explained an example in which the resistive string DA converters 113a and 114a are disposed as the specific configuration example of the DA converters 113 and 114, respectively, the present invention is not limited to this. The R2R resistor ladder DA converters 113c and 114c or current addition DA converters may be disposed as specific configuration examples of the DA converters 113 and 114, respectively. A configuration of the current addition DA converter shall be explained as follows.

(Current Output DA Converters 213b and 214b)

Figure 18:
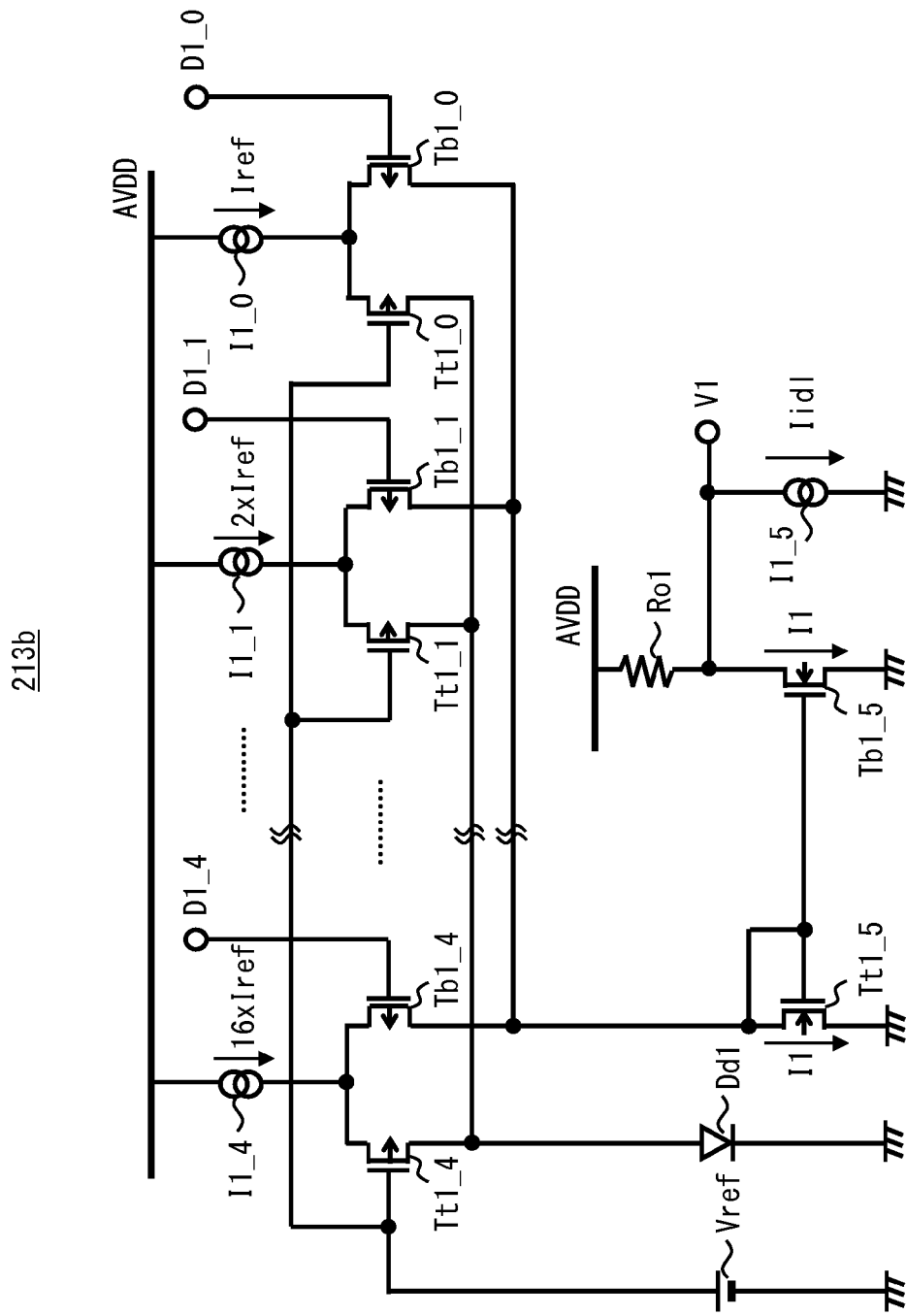
FIG. 18 is a circuit diagram showing a specific configuration example of one DA converter that is disposed in the current output circuit shown in FIG. 16.
Figure 19:
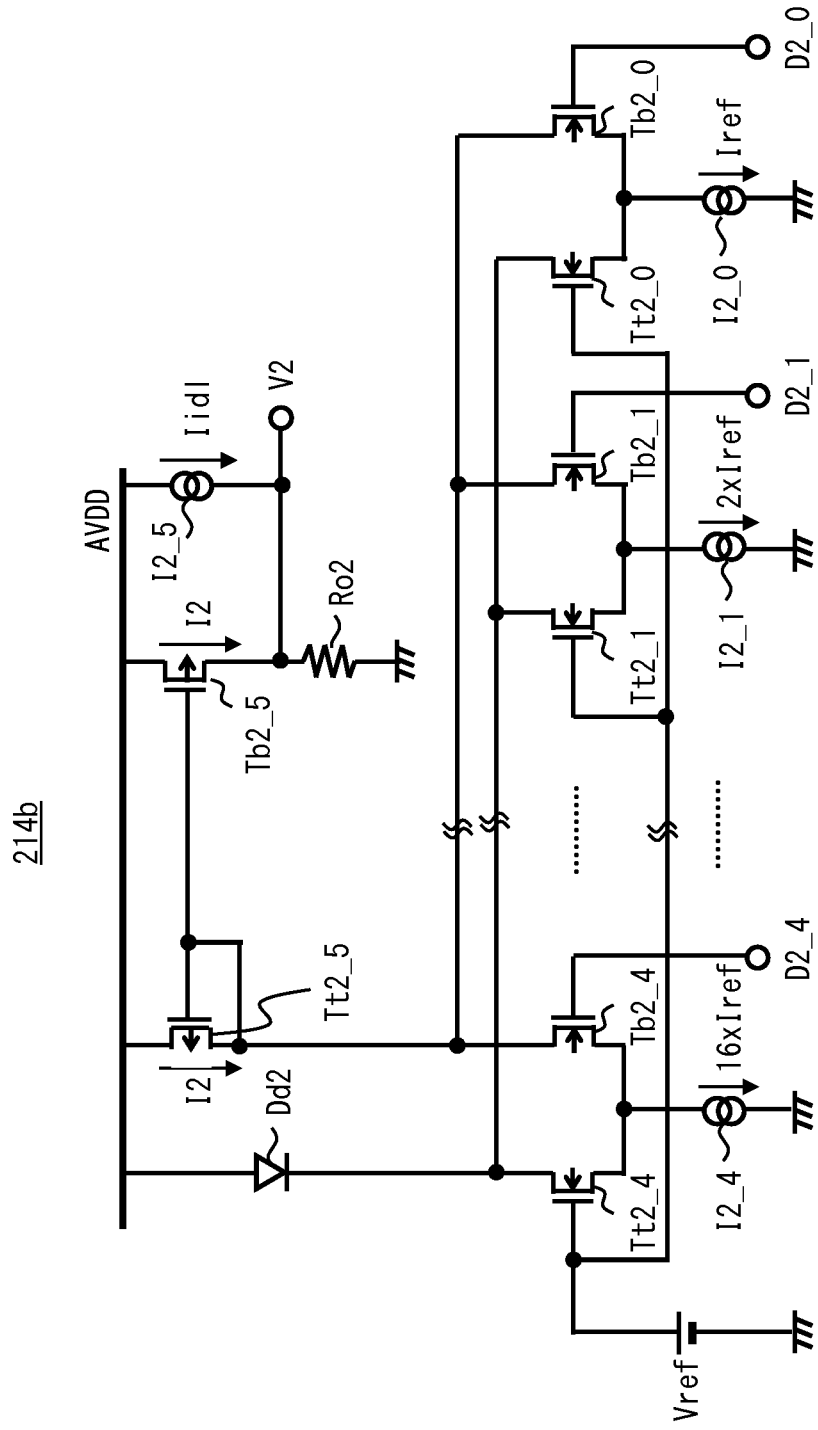
FIG. 19 is a circuit diagram showing a specific configuration example of the other DA converter that is disposed in the current output circuit shown in FIG. 16.

FIGS. 18 and 19 are drawings showing current addition DA converters 213b and 214b as a specific configuration example of the DAC converters 113 and 114, respectively.

The DA converters 213b and 113 have the same configuration except that the former further includes a constant current source I1_5 that causes an idling current Iid1 to flow from an output terminal of the DA converter 213b to the ground voltage terminal GND. Thus, the current Iid1 always flows through the resistive element Ro1. Accordingly, the reference value of the half-wave signal V1 that is output from the DA converter 213b indicates a voltage value lower than the power supply voltage AVDD by the idling voltage Vi(=Ro1×Iid1).

The DA converters 214b and 114 have the same configuration except that the former further includes a constant current source I2_5 that causes the idling current Iid1 to flow from the power supply voltage terminal AVDD to the output terminal of the DA converter 214b. Thus, the current Iid1 always flows through the resistive element Rot. Accordingly, the reference value of the half-wave signal V2 that is output from the DA converter 214b indicates a voltage value greater than the ground voltage GND by the idling voltage Vi(=Ro2×Iid1).

(Modified Example of Current Output Circuit 3)

Figure 20:
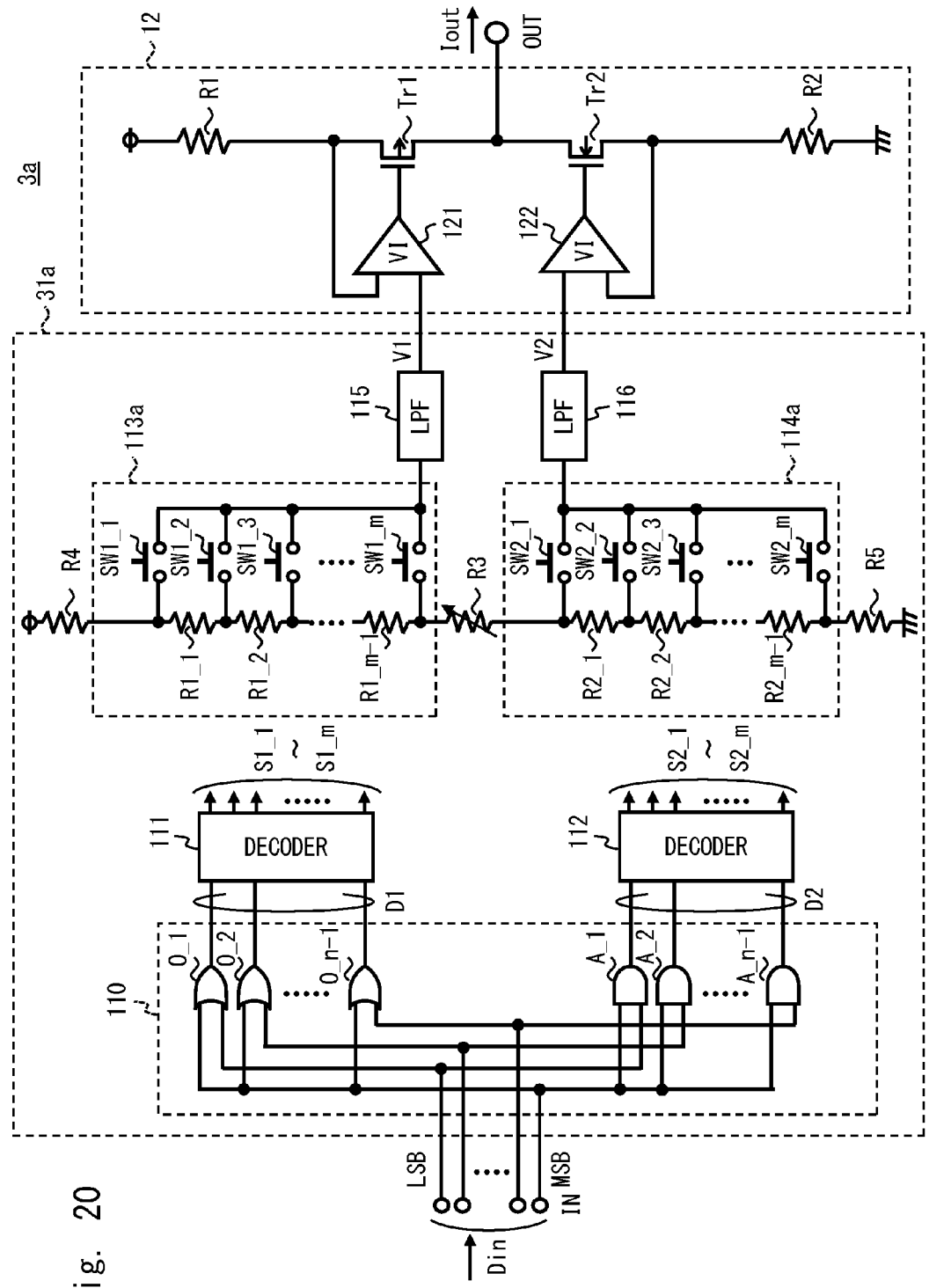
FIG. 20 is a diagram showing a modified example of the current output circuit according to the third embodiment.

FIG. 20 is a drawing showing a current output circuit 3a as a modified example of the current output circuit 3. The current output circuit 3a includes a pseudo sine wave separation circuit 31a in place of the pseudo sine wave separation circuit 31.

The pseudo sine wave separation circuit 31a and the pseudo sine wave separation circuit 31 have the same configuration except that the former further includes the variable resistive element R3. Specifically, the pseudo sine wave separation circuit 31a has the same configuration as that of the pseudo sine wave separation circuit 11 except that the former further includes the variable resistive element R3 of the second embodiment and the resistive elements R4 and R5 of the third embodiment.

By doing so, the current output circuit 3a can achieve the effects achieved by both of the current output circuits 2 and 3. In other words, as the variable resistive element R3 is included in the current output circuit 3a, the amplitude value Ia of the output current Iout can be changed depending on the usage. Further, as the resistive elements R4 and R5 are included in the current output circuit 3a, it is possible to reduce the distortion generated when the value of the output current Iout becomes zero.

Note that in the current output circuit 1a shown in FIG. 11, the amplitude value Ia of the output current Iout can be changed depending on the usage by adjusting the bias voltages Vrb1 and Vrt2 in a manner similar to the case of using the variable resistive element R3. Additionally, in the current output circuit 1a shown in FIG. 11, the distortion generated when the value of the output current Iout becomes zero can be reduced by adjusting the bias voltages Vrt1 and Vrb2 in a manner similar to the case of using the resistive elements R4 and R5.

As described so far, the current output circuits according to the first to third embodiments separate the digital pseudo sine wave into two pseudo sine waves, convert the pseudo half-waves into the analog half-wave signals, convert the voltages of the analog half-wave signals into currents, combine the currents, and output the current as the analog sine wave signal Iout. Accordingly, it is unnecessary for the current output circuits according to the first to third embodiments to include a large-scale analog circuit such as a gain adjusting circuit and a separation circuit for the analog sine wave. It is thus possible for the circuit size and current consumption of the current output circuits according the first to third embodiments to be reduced more than they can be reduced when the digital pseudo sine wave is converted into the analog sine wave, and then the analog sine wave is separated into two half-waves.

Further, the current output circuit 2 according to the second embodiment varies the bias voltages Vrb1 and Vrt2 of the respective DA converters 113a and 114a using the variable resistive element R3. This enables the current output circuit 2 according to the second embodiment to change the amplitude value Ia of the output current Tout depending on the usage.

Additionally, the current output circuit 3 according to the third embodiment uses the resistive elements R4 and R5 to set the idling voltage Vi to the reference voltages AVDD and GND of the respective DA converters 113a and 114a. This enables the current output circuit 3 according to the third embodiment to reduce the distortion generated when the value of the output current Iout becomes zero.

Although the invention made by the present inventor has been explained with reference to the exemplary embodiments, it is obvious that the invention is not limited by the same, and various modifications can be made without departing from the scope of the invention.

For example, the conductive type (p-type or n-type) of a semiconductor substrate, a semiconductor layer, and a diffusion layer (diffusion region) etc. may be inverted in the current output circuits according to the above embodiments. Therefore, when one of the conductive types of n-type and p-type is referred to as a first conductive type, and the other one of the conductive types of n-type and p-type is referred to as a second conductive type, the first conductive type may be p-type, and the second conductive type may be n-type. Alternatively, the first conductive type may be n-type, and the second conductive type may be p-type.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A current output circuit comprising:
   a separation circuit that separates a digital pseudo sine wave into first and second digital pseudo half-waves;
   a first DA converter that converts the first digital pseudo half-wave into a first analog half-wave signal;
   a second DA converter that converts the second digital pseudo half-wave into a second analog half-wave signal; and
   a voltage-circuit conversion circuit that converts voltages of the first and second half-wave signals into currents and outputs a current obtained by combining the currents, wherein
   the pseudo sine wave is represented by a digital code having an n (n is a natural number) bit width, and
   the separation circuit comprises:
      a plurality of OR circuits that output a logical OR between a value of a most significant bit representing a code in the digital code and values of bits other than the most significant bit as the first pseudo half-wave; and
      a plurality of AND circuits that output a logical AND between the value of the most significant bit in the digital code and the values of the hits other than the most significant bit as the second pseudo half-wave.

2. The current output circuit according to claim 1, wherein
   a first reference voltage that determines a reference value of an output is supplied to a high-potential power supply terminal of the first DA converter, and a first bias voltage that determines an amplitude of the output is supplied to a low-potential power supply terminal of the first DA converter,
   a second reference voltage that determines a reference value of an output is supplied to a low-potential power supply terminal of the second DA converter, and a second bias voltage that determines an amplitude of the output is supplied to a high-potential power supply terminal of the second DA converter, and a potential difference between the first reference voltage and the first bias voltage is substantially the same as a potential difference between the second reference voltage and the second bias voltage.

3. The current output circuit according to claim 1, wherein the first reference voltage that determines the reference value of the output is supplied to the high-potential power supply terminal of the first DA converter, and the first bias voltage that determines the amplitude of the output is supplied to the low-potential power supply terminal of the first DA converter, the second reference voltage that determines the reference value of the output is supplied to the low-potential power supply terminal of the second DA converter and the second bias voltage that determines the amplitude of the output is supplied to the high-potential power supply terminal of the second DA converter, and the first reference voltage is a power supply voltage, and the second reference voltage is a ground voltage.

4. The current output circuit according to claim 3 further comprising a variable resistive element that is disposed between the low-potential power supply terminal of the first DA converter and the high-potential power supply terminal of the second DA converter, wherein the first and second DA converters are resistive string or R2R resistor ladder DA converters.

5. The current output circuit according to claim 3, further comprising:

a first variable resistive element that is disposed between the low-potential power supply terminal of the first DA converter and a power supply that generates the first bias voltage; and a second variable resistive element that is disposed between the high-potential power supply terminal of the second DA converter and a power supply that generates the second bias voltage, wherein the first and second DA converters are resistive string or R2R resistor ladder DA converters.

6. The current output circuit according to claim 3, further comprising:

a first resistive element that is disposed between the high-potential power supply terminal of the first DA converter and a power supply that generates the first reference voltage; and a second resistive element that is disposed between the low-potential power supply terminal of the second DA converter and a power supply that generates the second reference voltage, wherein the first and second DA converters are resistive string or R2R resistor ladder DA converters.

7. The current output circuit according to claim 4, further comprising:

a first resistive element that is disposed between the high-potential power supply terminal of the first DA converter and a power supply that generates the first reference voltage; and a second resistive element that is disposed between the low-potential power supply terminal of the second DA converter and a power supply that generates the second reference voltage, wherein the first and second DA converters are resistive string or R2R resistor ladder DA converters.

8. A current output circuit comprising:

a separation circuit that separates a digital pseudo sine wave into first and second digital pseudo half-waves;

a first DA converter that converts the first digital pseudo half-wave into a first analog half-wave signal;

a second DA converter that converts the second digital pseudo half-wave into a second analog half-wave signal; and a voltage-current conversion circuit that converts voltages of the first and second half-wave signals into currents and outputs a current obtained by combining the currents, wherein the voltage-current conversion circuit comprises:

a third resistive element that is disposed between a high-potential power supply terminal and an output terminal, the high-potential power supply terminal being supplied with the power supply voltage;

a first driver transistor that is disposed between the third resistive element and the output terminal;

a first amplifier that amplifies a potential difference between a source voltage of the first driver transistor and a voltage of the first half-wave signal and supplies the amplified potential difference to a gate of the first driver transistor;

a fourth resistive element that is disposed between a low-potential power supply terminal and the output terminal, the low-potential power supply terminal being supplied with the ground voltage;

a second driver transistor that is disposed between the fourth resistive element and the output terminal; and a second amplifier that amplifies a potential difference between a source voltage of the second driver transistor and a voltage of the second half-wave signal and supplies the amplified potential difference to a gate of the second driver transistor.

* * * * *